US010520557B2

United States Patent
Sanchez et al.

(10) Patent No.: US 10,520,557 B2
(45) Date of Patent: Dec. 31, 2019

(54) SYSTEMS, DEVICES, AND METHODS FOR RECORDING AND TRANSMITTING DATA

(71) Applicant: ArthroKinetic Institute, LLC, Santa Barbara, CA (US)

(72) Inventors: Eric Sanchez, Santa Barbara, CA (US); Robert Woods, Henderson, NV (US); John Stump, Santa Barbara, CA (US); Daniel Price, Grass Valley, CA (US)

(73) Assignee: ARTHROKINETIC INSTITUTE, LLC, Montecito, CA (US)

( * ) Notice: Subject to any disclaimer, the term of this patent is extended or adjusted under 35 U.S.C. 154(b) by 281 days.

(21) Appl. No.: 14/696,349

(22) Filed: Apr. 24, 2015

(65) Prior Publication Data

US 2015/0362331 A1    Dec. 17, 2015

Related U.S. Application Data

(60) Provisional application No. 61/984,024, filed on Apr. 24, 2014.

(51) Int. Cl.
*A63B 69/36* (2006.01)
*G01R 33/02* (2006.01)
(Continued)

(52) U.S. Cl.
CPC .......... *G01R 33/02* (2013.01); *A63B 24/0003* (2013.01); *A63B 53/14* (2013.01); *A63B 60/16* (2015.10); *G01C 21/12* (2013.01); *G01R 33/0206* (2013.01); *A63B 2102/02* (2015.10); *A63B 2102/04* (2015.10); *A63B 2102/06* (2015.10); *A63B 2102/065* (2015.10);
(Continued)

(58) Field of Classification Search
CPC ................................. A63B 2220/836

USPC .......................................................... 473/223
See application file for complete search history.

(56) References Cited

U.S. PATENT DOCUMENTS 5,893,891 A * 4/1999 Zahedi ...................... A61F 2/68
                                                       623/24
6,299,553 B1    10/2001 Petuchowski et al.
(Continued)

OTHER PUBLICATIONS

[No Author Listed] 3BaysGSA. Perception Digital, Ltd. Product information. Retrieved on Oct. 29, 2014 from <http://www.3bayslife.com/gsa/home.php>. 23 pages, 2012.
(Continued)

*Primary Examiner* — Min Huang
(74) *Attorney, Agent, or Firm* — Lee Sullivan Shea & Smith LLP

(57) ABSTRACT

Systems, devices, and methods for recording and transmitting data are provided. The systems, devices, and methods can be used in a variety of contexts, including in conjunction with swinging devices and prosthetics. In one exemplary embodiment, the sensor is configured in a manner that allows it be omni-directional such that its orientation with respect to the object for which it is detecting data is irrelevant to the ability to accurately record and transmit data. In another exemplary embodiment, the system allows a user to use the same sensor across multiple platforms, such as using it for golf and prosthetics, for golf and tennis, or for a regular golf swing and a putting stroke. Other devices, systems, methods, and uses of the same are also provided.

16 Claims, 18 Drawing Sheets

(51) Int. Cl.

| | | |
|---|---|---|
| *G01C 21/12* | (2006.01) | |
| *A63B 24/00* | (2006.01) | |
| *A63B 53/14* | (2015.01) | |
| *A63B 60/16* | (2015.01) | |
| *G01P 15/18* | (2013.01) | |
| *G01C 19/00* | (2013.01) | |
| *A63B 102/24* | (2015.01) | |
| *A63B 102/06* | (2015.01) | |
| *A63B 102/16* | (2015.01) | |
| *A63B 102/02* | (2015.01) | |
| *A63B 102/14* | (2015.01) | |
| *A63B 102/04* | (2015.01) | |
| *A63B 102/18* | (2015.01) | |

(52) U.S. Cl.
CPC ....... *A63B 2102/14* (2015.10); *A63B 2102/16* (2015.10); *A63B 2102/18* (2015.10); *A63B 2102/24* (2015.10); *A63B 2207/02* (2013.01); *A63B 2220/10* (2013.01); *A63B 2220/34* (2013.01); *A63B 2220/40* (2013.01); *A63B 2220/62* (2013.01); *A63B 2220/89* (2013.01); *A63B 2225/50* (2013.01); *G01C 19/00* (2013.01); *G01P 15/18* (2013.01)

(56) References Cited

U.S. PATENT DOCUMENTS

| | | | |
|---|---|---|---|
| 7,219,033 B2 | 5/2007 | Kolen | |
| 7,494,430 B2 | 2/2009 | Choi | |
| 7,736,242 B2 | 6/2010 | Stites et al. | |
| 7,821,407 B2 | 10/2010 | Shears et al. | |
| 8,052,539 B2 | 11/2011 | Kimber | |
| 8,109,816 B1 | 2/2012 | Grober | |
| 8,118,687 B1 | 2/2012 | Galloway | |
| 8,257,189 B2 | 9/2012 | Koudele et al. | |
| 8,425,292 B2 | 4/2013 | Lui et al. | |
| 8,430,770 B2 | 4/2013 | Dugan | |
| 8,449,402 B2 | 5/2013 | Jaekel et al. | |
| 8,465,376 B2 | 6/2013 | Bentley | |
| 2005/0054457 A1 | 3/2005 | Eyestone et al. | |
| 2005/0288119 A1 | 12/2005 | Wang et al. | |
| 2006/0052173 A1 | 3/2006 | Telford | |
| 2006/0166738 A1* | 7/2006 | Eyestone | A63B 15/005 463/36 |
| 2007/0270214 A1 | 11/2007 | Bentley | |
| 2008/0287205 A1 | 11/2008 | Katayama | |
| 2009/0247312 A1 | 10/2009 | Sato et al. | |
| 2010/0144456 A1* | 6/2010 | Ahern | A63B 57/00 473/222 |
| 2010/0204616 A1 | 8/2010 | Shears et al. | |
| 2011/0124440 A1 | 5/2011 | Ueda et al. | |
| 2011/0183780 A1 | 7/2011 | Leech et al. | |
| 2011/0184538 A1 | 7/2011 | Baker et al. | |
| 2011/0224012 A1* | 9/2011 | Hashimoto | A63B 69/3632 473/223 |
| 2011/0230273 A1 | 9/2011 | Niegowski et al. | |
| 2011/0250939 A1 | 10/2011 | Hobler | |
| 2012/0035003 A1 | 2/2012 | Moran et al. | |
| 2012/0052972 A1 | 3/2012 | Bentley | |
| 2012/0143093 A1 | 6/2012 | Stirling et al. | |
| 2012/0157241 A1* | 6/2012 | Nomura | A63B 69/0002 473/422 |
| 2012/0179418 A1* | 7/2012 | Takasugi | A63B 69/36 702/151 |
| 2012/0277018 A1* | 11/2012 | Boyd | A63B 24/0003 473/224 |
| 2012/0296454 A1 | 11/2012 | Lui et al. | |
| 2012/0316004 A1 | 12/2012 | Shibuya | |
| 2012/0322569 A1 | 12/2012 | Cottam | |
| 2013/0059672 A1* | 3/2013 | Davenport | A63B 69/3632 473/222 |
| 2013/0073248 A1* | 3/2013 | Perkins | A61B 5/6895 702/141 |
| 2013/0090179 A1* | 4/2013 | Davenport | A63B 24/0006 473/223 |
| 2013/0095940 A1 | 4/2013 | Dugan | |
| 2013/0095941 A1* | 4/2013 | Bentley | H05K 5/0204 473/223 |
| 2013/0102419 A1 | 4/2013 | Jeffery et al. | |
| 2013/0165246 A1 | 6/2013 | Jeffery et al. | |
| 2013/0203518 A1* | 8/2013 | Hatton | A63B 53/047 473/223 |
| 2013/0225335 A1 | 8/2013 | Dugan | |
| 2013/0267339 A1 | 10/2013 | Boyd et al. | |
| 2013/0298671 A1* | 11/2013 | Acar | G01C 19/5712 73/504.12 |
| 2014/0274439 A1 | 9/2014 | Sanchez et al. | |
| 2014/0357392 A1* | 12/2014 | Goel | G06K 9/00342 473/223 |
| 2015/0111657 A1* | 4/2015 | Shibuya | G06K 9/00342 473/223 |

OTHER PUBLICATIONS

[No Author Listed] 5 Pack Strike N Swipe Reusable Face Tape. InnovaGolf.com. Product description. Retrieved on Sep. 16, 2014 from <www.innovagolf.com/strikenswipe.html>. 2 pages. Publication date is unknown.

[No Author Listed] Advantage Longshot. Why No Other Impact Recording System Even Comes Close. LongShotGolf.com. Product Description. Retrieved on Sep. 16, 2014 from <https://www.longshotgolf.com/pdf%20pages/AdvantageLongShot.pdf>. 1 page. Publication date is unknown.

[No Author Listed] Artengo Personal Coach. Artengo, Decathlon SA. Product information. Retrieved on Nov. 5, 2014 from <http://en.artengo.com/>. 51 pages. Publication date is unknown.

[No Author Listed] Babolat Play. Babolat VS. Product information. Retrieved on Nov. 5, 2014 from <http://en.babolatplay.com>. 17 pages. Publication date is unknown.

[No Author Listed] Blast Motion. Product information. Retrieved on Ferbruary 17, 2015 from <www.blastmotion.com>. 33 pages. Publication date is unknown.

[No Author Listed] Flightscope. Company overview. Retrieved on Oct. 29, 2014 from <http://flightscope.com/company>. 24 pages. Publication date is unknown.

[No Author Listed] Golf. Wikipedia. Jun. 12, 2012, 18 pages. Retrieved on Nov. 5, 2014 from <http://en.wikipedia.org/w/index.php?title=Golf&oldid=497011080>. Archived version of the page as last edited Jun. 11, 2012.

[No Author Listed] Handbook of Thermochromic Liquid Crystal Technology. Hallcrest, Glenview, IL, 1991, 36 pages.

[No Author Listed] Introducing Game Golf: The World's first automatic shot tracking system for today's golfer. Game Golf. Active Mind Technology, Inc. 2014, 5 pages. Retrieved on Sep. 16, 2014 from <http://www.gamegolf.com/products/en-us/gamegolf>.

[No Author Listed] Lot of 3 Dead On Impact Indicator Marker. DeadOn: Impact Indicator. Retrieved on Oct. 29, 2014 from <http://www.emtcompany.com/misc/lot-of-3-dead-on-impact-indicator-marker.html>. 3 pages. Publication date is unknown.

[No Author Listed] Nike+ FuelBand: First Generation. Nike, Inc. Product information. Retrieved on Oct. 29, 2014 from <http://www.amazon.com/Nike-WM0105-001-FuelBand-Black-Small/dp/B008RRLJUI>. 6 pages, 2012.

[No Author Listed] Nike+ iPod. Nike, Inc., and Apple, Inc. Product information. Retrieved on Oct. 29, 2014 from <http://www.apple.com/ipod/nike/run.html>. 3 pages. Publication date is unknown.

[No Author Listed] Nike+ LIVESTRONG SportBand. Nike, Inc. Product information. Retrieved on Oct. 29, 2014 from <http://www.sports-accessory.com/2011/1108/nike-livestrong-sportband/>. 7 pages, 2011.

[No Author Listed] Nike+ Sensor. Nike, Inc., and Apple, Inc. Product information. Retrieved on Oct. 29, 2014 from <http://store.nike.com/us/en_us/pd/sensor/pid-162953/pgid-781981>. 5 pages. Publication date is unknown.

(56) References Cited

OTHER PUBLICATIONS

[No Author Listed] Nike+ Sportband. Nike, Inc. Product information. Retrieved on Oct. 29, 2014 from <https://secure-nikeplus.nike.com/plus/products/sport_band>. 5 pages. Publication date is unknown.
[No Author Listed] Nike+ Sportwatch GPS. Nike, Inc. Product information. Retrieved on Oct. 29, 2014 from <https://secure-nikeplus.nike.com/plus/products/sport_watch>. 3 pages. Publication date is unknown.
[No Author Listed] Sensor Products Inc.: Tactile Pressure Experts. Sensor Products Inc. Company overview. Retrieved Oct. 29, 2014 from <http://www.sensorprod.com/index.php>. 4 pages. Publication date is unknown.
[No Author Listed] Sony Smart Tennis Sensor. Sony Corporation. Product information. Retrieved on Nov. 5, 2014 from <http://smarttennissensor.sony.net/NA/>. 10 pgs. Publication date is unknown.
[No Author Listed] Swingbyte 2. Swingbyte. Product information. Retrieved on Oct. 29, 2014 from <https://www.swingbyte.com/store>. 1 page. Publication date is unknown.
[No Author Listed] SwingTIP—Golf Swing Analyzer Sensor and App. Mobiplex, Inc. Product information. Retrieved on Oct. 29, 2014 from <http://mobicoach.com/product/swingtip-golf-swing-analyzer/. 6 pages. Publication date is unknown.
[No Author Listed] Tekscan. Company overview. Retrieved on Oct. 29, 2014 from <http://www.tekscan.com>, 11 pages. Publication date is unknown.
[No Author Listed] Zepp. Zepp US Inc. Product information. Retrieved on Oct. 29, 2014 from <https://www.zepp.com/store>. 11 pages. Publication date is unknown.

Aeschliman et al., Use of shear-stress-sensitive, temperature-insensitive liquid crystals for hypersonic boundary-layer transition detection. Sandia National Labs, Apr. 1, 1997, 30 pages.
Cheetham et al., Comparison of kinematic sequence parameters between amateur and professional golfers. Science and Golf V Proceedings of the World Scientific Congress of Golf, pp. 30-36, 2008.
Cheetham, P.J., Analyzing the Golf Swing in 6 Degrees of Freedom with AMM 6DOF Systems. Published Jun. 6, 2012, 11pgs. Retrieved on Nov. 5, 2014 from <http://philcheetham.com/analyzing-the-golf-swing-in-6-degrees-of-freedom-with-amm-6dof-systems/.
Normani, Franco, The physics of a golf swing. Real World Physics Problems. Jun. 13, 2012, 12 pages. Retrieved on Nov. 5, 2014 from <http://www.real-world-physics-problems.com/physics-of-a-golf-swing.html>.
Ogawa et al., Visualization of impact force using pressure sensitive paper. Journal de Physique IV France, vol. 10, issue PR9, pp. 185-190, 2000.
Penner, A.R., The physics of golf. Reports on Progress in Physics, vol. 66, pp. 131-171, 2003.
[No Author Listed] Bring it 'n' Swing it! Sweet Spot. Sweet Spot—Division of SanWood, LLC. Product Brochure, 2014, 9 pages.
[No Author Listed] Sweet Spot. SanWood, LLC. Brochure. 2014. 7 pages.
[No Author Listed] Sweet Spot. SanWood, LLC. Brochure. 2014. 10 pages.

* cited by examiner

FIG. 6A
FIG. 6B
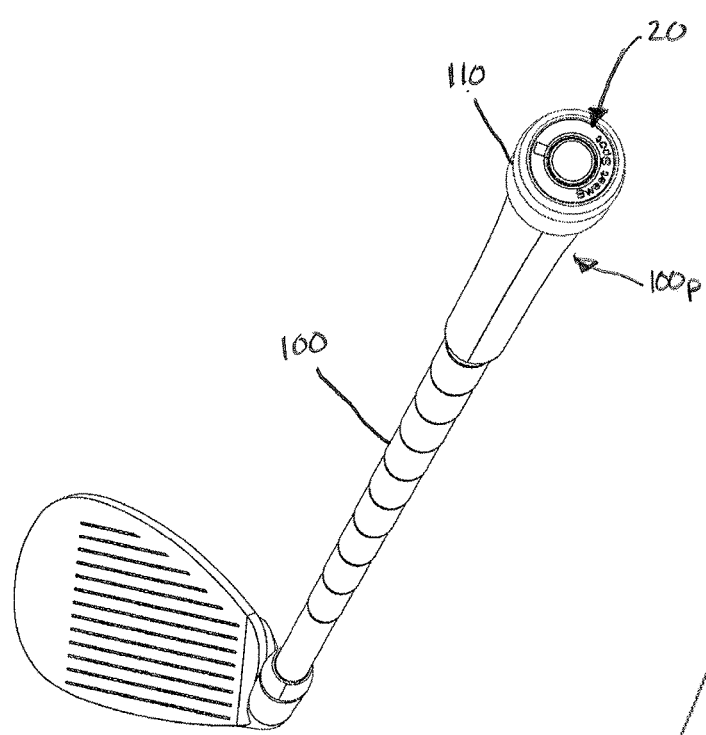
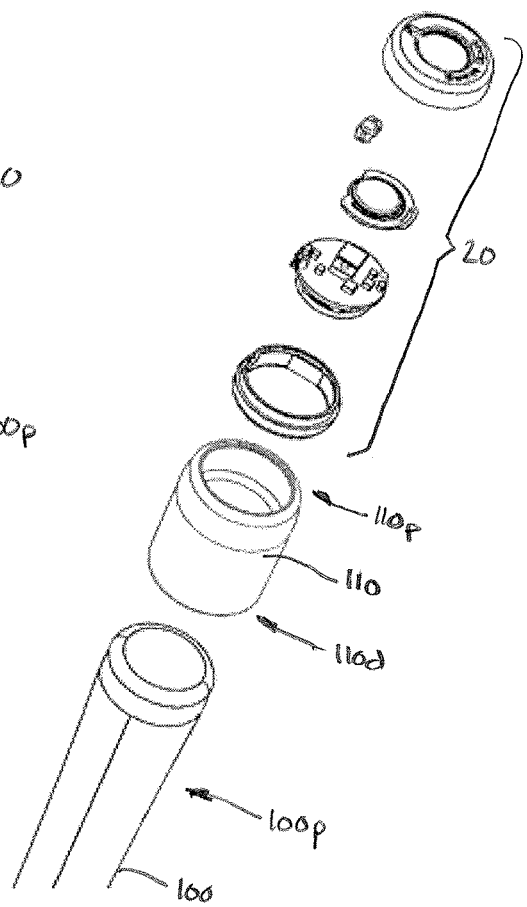

FIG. 9A
FIG. 9B
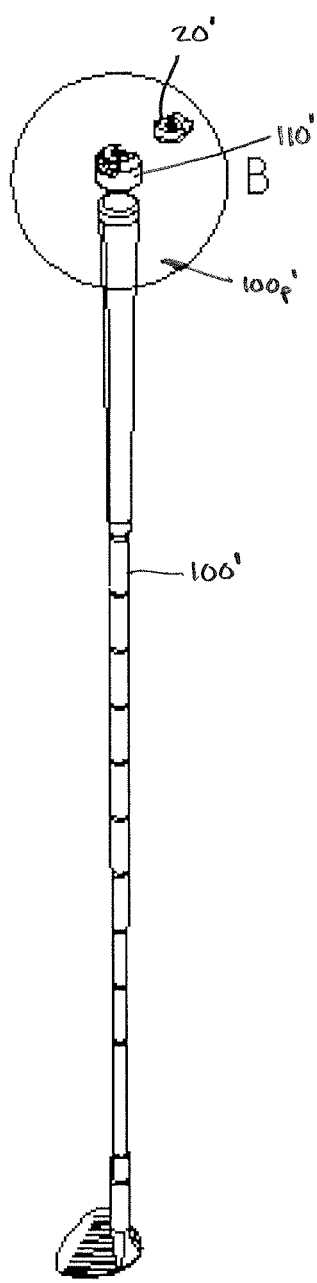
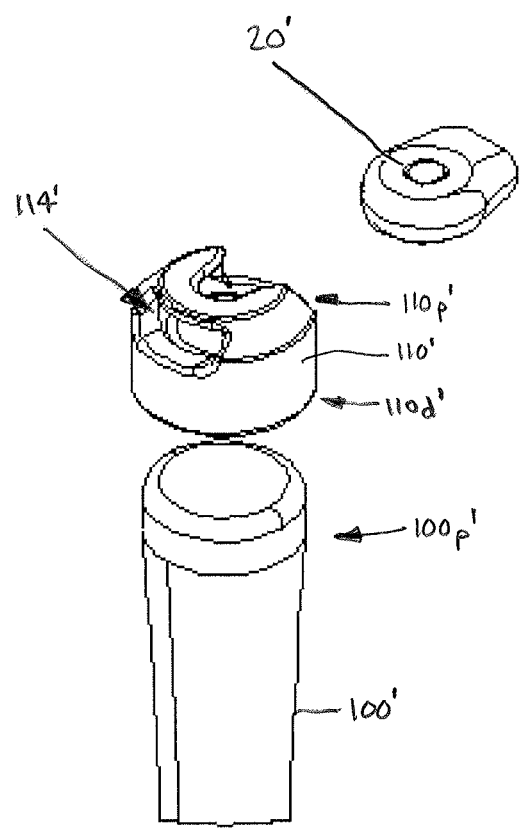

# SYSTEMS, DEVICES, AND METHODS FOR RECORDING AND TRANSMITTING DATA

CROSS REFERENCE TO RELATED APPLICATION

The present disclosure claims priority to U.S. Provisional Application No. 61/984,024, entitled "Sensor, Gateway, and Mobile Application for Swinging Devices," which was filed on Apr. 24, 2014, and which is incorporated by reference herein in its entirety.

FIELD

The present disclosure relates to systems, devices, and methods for recording and transmitting data, and more particularly relates to a sensor that can be used in conjunction with a control or mobile application to record and transmit data.

BACKGROUND

Beginners, avid recreational and amateur players, and professionals are constantly looking for new ways to learn and improve their swing fundamentals in a variety of sports, such as golf, tennis, baseball, lacrosse, hockey, billiards, and table tennis. Beginners may be interested in learning how to swing in a fundamentally sound manner, while recreational, amateur, and professional players may be interested in finding ways to improve their swings. While tools exist for these purposes, they are often expensive, and as a result, typically have a limited availability, such as to organizations and professional athletes. Further, many of these tools, such as golf simulators, may not provide a realistic user experience.

Devices and systems that are marginally more available to the everyday user are typically configured for use in only a single sport. Thus, for any person interested in obtaining data and/or collecting and using information for two sports, such as golf and tennis, that person must invest in two different products. Still further, another limitation of supposed "plug-and-play" options in this space requires the sensor to have a particular alignment with respect to the swinging device. For example, typically a golf sensor includes an arrow on it that must be aligned with a specific location on the golf club in order of the data to record and/or transmit data in any sort of accurate manner. As a result, users often lose data because of misalignment, either because the sensor was not properly aligned to start, or because the sensor shifts during use and becomes misaligned. Small imperfections in sensor orientation can lead to large errors in the shape of a swing detected by a sensor. The process of making sure the sensor is aligned from to start can be a bit cumbersome and tedious, as can checking to make sure alignment is properly maintained throughout the duration of use.

Additionally, to the extent existing sensors share data, the sharing typically involves transmitting the data to a "smart device," e.g., a smart phone, which in turn can transmit the data to a third location, such as the cloud. However, relying on a smart device as part of the data sharing process can undesirably impact performance of the smart device. Because the smart device is often being used for multiple purposes, such as receiving telephone calls and e-mails, playing music, etc., the additional use for data recordation and/or transmission can bog down the device trying to perform too many tasks at the same time.

Accordingly, there is a need for plug-and-play sensors and/or systems that are accessible and useful for all users, regardless of their experience level and financial means. There is also a need for plug-and-play sensors and/or systems that can be used for multiple sports, and that can be user-friendly such that there is no specific orientation requirement for using that sensor with a particular swinging device. There is still a further need for alternative devices and systems can store, send, and retrieve data at optimal times so as not to impact ongoing functions being run on a smart device being used in conjunction with the data gathering and sending. Still further, sensors and/or systems that can be easily adapted for use in other, non-sports fields in which data is collected is also desirable.

SUMMARY

Systems, devices, and methods are generally provided for recording and transmitting data. One of the two primary benefits of the disclosures provided for herein is that the sensors and related components, such as control or mobile applications, can be used across multiple platforms. This includes, by way of example, use across different fields or uses (e.g., use for athletic endeavors and use in the medical field), use across different modes (e.g., use in the same field, such as athletic endeavors, but in different sub-categories of that field, such as sports involving swinging devices, like golf and lacrosse), and use across different stages (e.g., use in the same mode, such as golf, but in different sub-categories of that field, such as performing a normal golf swing with a wood, iron, hybrid, or wedge, and performing a putt). The other of the two primary benefits is that the sensor is configured in a manner that allows it to be oriented at any location across a 360° spectrum with respect to a surface to which it is coupled. This capability is referred to herein as making the sensor omni-directional. A user can thus plug the sensor directly into its desired location without worrying about whether it needs to be spun in a particular direction in order to set a particular reference orientation.

In one exemplary embodiment, a sensor for measuring data is provided and includes a housing, a circuit board assembly disposed within the housing, and a power source electrically coupled to the circuit board assembly to provide power to components of the circuit board assembly. The circuit board assembly can include a wireless transmission element and at least one of an accelerometer, a gyroscope, and a magnetometer. The sensor can be configured to be attached to an object and measure data associated with the object regardless of an orientation of a coordinate system of the sensor with respect to an orientation system of the object. In some embodiments, the object can be a device that is intended to be swung, such as a golf club, baseball bat, lacrosse stick, hockey stick, etc., while in other embodiments the object can be a prosthetic.

The housing can also include a button associated therewith. The button can be configured to selectively activate the power source to supply power to components of the circuit board assembly (e.g., an accelerometer, a gyroscope, a magnetometer, a microcontroller, a wireless transmission component such as a Bluetooth Low Energy radio component, an LED diode, and a switch). A microcontroller can also be associated with the circuit board. The microcontroller can be configured to provide commands to components of the circuit board assembly to control operation of the sensor.

In some embodiments, the coordinate system of the sensor includes: (1) an x-axis that includes a center of the sensor on an outer surface of the housing and a defined location on the outer surface of the housing a distance away from the center; (2) a z-axis that includes a center of the sensor and extends vertically upwards such that it is approximately perpendicular to the outer surface of the housing; and (3) a y-axis that is a cross product of the x-axis and the z-axis. An angle (θ) defined by the y-axis of the coordinate system of the sensor and a y-axis of the coordinate system of the object can be determined and accounted for when measuring data associated with the object, the angle being able to have a non-zero value.

Further, in some embodiments, the object is a swing device, and the coordinate system of the object includes: (1) a z-axis that extends approximately vertically along a shaft of the swinging device in a direction similar to the direction of the z-axis of the coordinate system of the sensor; (2) a y-axis that is approximately parallel to a head of the swinging device that is coupled to the shaft of the swinging device and extends towards an object to be struck by the head; and (3) an x-axis that is approximately perpendicular to the head of the swinging device and extends to one side of a user of the swinging device.

In some embodiments, the angle (θ) defined by the y-axis of the coordinate system of the sensor and the y-axis of the coordinate system of the object is determined based on measurements made by the accelerometer along the x-axis and the y-axis of the coordinate system of the sensor. In some other embodiments, the angle (θ) defined by the y-axis of the coordinate system of the sensor and the y-axis of the coordinate system of the object is determined based on one or more rotational velocity vectors measured by the gyroscope along the x-axis and the y-axis of the coordinate system of the sensor. A determination of the angle (θ) defined by the y-axis of the coordinate system of the sensor and the y-axis of the coordinate system of the object can account for a direction that the object is swung. Further, a determination of the angle (θ) defined by the y-axis of the coordinate system of the sensor and the y-axis of the coordinate system of the object can account for a wrist rotation that occurs when an object is swung.

One exemplary embodiment of a system for use in multiple swinging contexts includes a sensor configured to be associated with multiple types of swinging devices and a control application configured to communicate with the sensor to adjust operation parameters that correlate with the type of swinging device to which the sensor is attached. Data that is determined and transmitted by the sensor is based on a type of use for the sensor selected using the control application.

In some embodiments, the system can include an adaptor configured to attach to one or more types of swinging devices, and further configured to receive the sensor to associate the sensor with one or more types of swinging devices. The sensor can include at least one of an accelerometer, a gyroscope, and a magnetometer. Still further, in some embodiments, the sensor can include a microcontroller.

The operation parameters that are adjusted based on communication from the control application can include at least one of the follow parameters: (1) event detection parameters; (2) selectively activating axes of information associate with at least one of an accelerometer, a gyroscope, and a magnetometer of the sensor; (3) a sampling rate of at least one of an accelerometer, a gyroscope, and a magnetometer of the sensor; (4) a sampling period of the sensor; and (5) at least one of a resolution and a dynamic range of the sensor.

In some embodiments, the control application can include one or more learning modules that are activated based on the type of use for the sensor selected using the control application. The sensor can be configured to transmit data wirelessly to at least one of a smart device and a gateway.

One exemplary embodiment of a method for measuring data includes attaching a sensor to an object, instructing the sensor to detect particular types of data based on the type of object to which the sensor is attached, and receiving data from the sensor based on the types of data the sensor is instructed to detect. The sensor is attached to an object at any orientation such that a coordinate system of the sensor is located at any location with respect to an akin coordinate system of the object.

The method can further include steps of detaching the sensor from the object, attaching the sensor to a second object, instructing the sensor to detect particular types of data based on the type of object to which the sensor is attached, and receiving data from the sensor based on the types of data the sensor is instructed to detect. The sensor can be attached to this second object at any orientation such that a coordinate system of the sensor is located at any location with respect to an akin coordinate system of the second object. The second object can be a different type of object than the first object (e.g., one can be a golf club and the other can be a tennis racket). Further, in performing the method, in some embodiments no modifications are made to existing software of the sensor when attached to either the first object or the second object such that a user can attach and use the same sensor to the first object and the second object in real time without significant reprogramming.

In some embodiments, the first object can be a first type of swinging device (e.g., a golf club) and the second object can be a second type of a swinging device (e.g., a lacrosse stick). In some other embodiments, including those in which the sensor is only attached to a first object, the first object can be a prosthetic. The sensor can include at least one of an accelerometer, a gyroscope, and a magnetometer, at least one of which can be used to define an angle (θ) disposed between a y-axis of the coordinate system of the sensor and a y-axis of the coordinate system of the object, with the angle (θ) having a non-zero value.

BRIEF DESCRIPTION OF DRAWINGS

This invention will be more fully understood from the following detailed description taken in conjunction with the accompanying drawings, in which:

FIG. 6A is a perspective top view of the sensor of FIG. 1A disposed in one exemplary embodiment of an adaptor that is coupled to a handle of a golf club;

FIG. 6B is an exploded view of the sensor and adaptor of FIG. 6A;

FIG. 9A is a side view of another exemplary embodiment of a sensor and adaptor that is coupled to a handle of a golf club;

FIG. 9B is a detailed perspective side view of the sensor, adaptor, and handle of FIG. 9A;

DETAILED DESCRIPTION

Figure 1A:
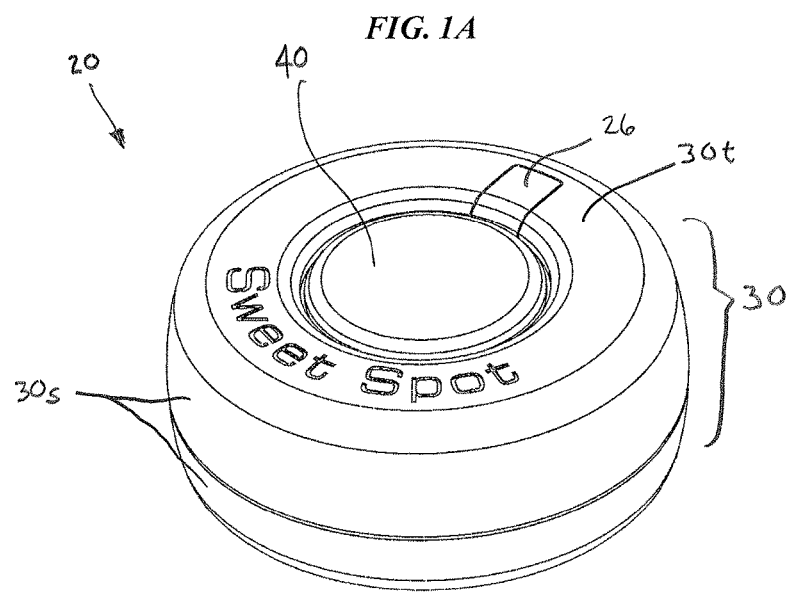
FIG. 1A is a perspective view of one exemplary embodiment of a sensor configured to record and transmit data.
Figure 1B:
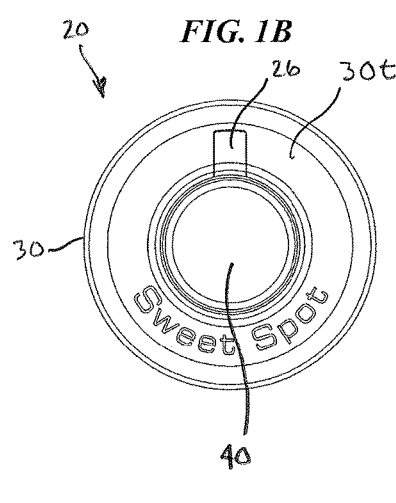
FIG. 1B is a top view of the sensor of FIG. 1A.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. For example, while in the illustrated embodiments sensors and systems are shown being used in conjunction with a golf club, a person skilled in the art will understand that the sensors, systems, and related methods can be adapted for use with other swinging devices, such as baseball bats, tennis rackets, lacrosse sticks, hockey sticks, billiards cues, badminton rackets, squash rackets, racquetball rackets, and table tennis rackets, among other equipment that can be swung. Likewise, the embodiments provided for herein are not limited to use only in the context of swinging sports or athletics in general. A person skilled in the art will understand that the sensors, systems, and related methods provided for herein can be adapted for use in other contexts, such as in the medical field, for instance in obtaining data related to wearing and using prosthetics.

The features illustrated or described in connection with one exemplary embodiment may be combined with the features of other embodiments. Such modifications and variations are intended to be included within the scope of the present invention. Further, a person skilled in the art will recognize that to the extent a sensor provided for herein, or a sleeve used to couple a sensor to an object such as a golf club, has a particular shape, size, or is described as being made from a particular material, such descriptions are non-limiting and that sensors, sleeves, and other components thereof or associated therewith can be adapted to have any number of shapes, sizes, features, or be made of various materials depending, at least in part, on the other components with which the sensor, sleeve, etc. is used, how attachment between the sensor, sleeve, and object is achieved, and what the desired data is that is measured and transmitted.

Still further, to the extent a system for use in conjunction with sensors provided for herein are described as being or being associated with a control or mobile application, a person skilled in the art will recognize that such systems or applications can be adapted for use on any devices capable of receiving and/or transmitting information therewith, such as phones, tablets, phone-tablets or "phablets," computers, music players (e.g., iPods®), wearable devices (e.g., watches, rings, bracelets, eyeglasses, virtual reality headsets, chest-bands), etc. The use of the term "mobile application" or "mobile app" by no means limits any aspect of this disclosure to only being used with smart phones or the like.

Sensors for use in determining and transmitting data are provided for herein. The sensors can also be part of a system, which can include one or more features also provided for herein, such as a sleeve or other attachment component to mate the sensor with an object for which measurements are desired to be taken, or a control application for use in receiving and using the data. The sensors and related components of a system can be used in multiple fields, including but not limited to sports and prosthetics, and across multiple device types within a particular field, e.g., golf, baseball, tennis, lacrosse, hockey, billiards, badminton, squash, racquetball, and table tennis. The sensors and related system components can also be used in multiple subclasses for the particular field, such as on an iron and on a putter for golf.

Significantly, the sensors and related systems are configured in a manner, e.g., using algorithms provided for herein, that allow the same sensor and related system to be used in conjunction with one type of swinging device (e.g., a golf club, or more specifically an iron) and then a second type of swinging device (e.g., a baseball bat or a putter) without requiring significant reprogramming by a user. Rather, a user can attach the sensor to a second device, select a pre-programmed use type, and the system makes any appropriate adjustments in view of the selected use type such that the user can interact with the sensor and system in this second use without any further input. Thus, no significant reprogramming is required on the part of the user. In alternative embodiments, the system and/or sensor can be adapted to recognize the type of environment in which it is being used, and thus the sensor or system can make the appropriate adjustments based on the determination that it makes.

Data detected by the sensors and/or related components thereof can be sent to a smart device, or to another location in which data and information can be stored (e.g., the cloud). In some instances the data can be transmitted in real time, while in other instances the data can be collected and stored until a desired optimal time for data transmission occurs, at which time the data is transmitted.

The sensors and systems provided for herein are easy to use. In some exemplary embodiments, a user can begin using the sensors and systems by attaching the sensor to the object from which data is to be measured, downloading a related control or mobile application, and using the sensor and control or mobile application simultaneously to measure and record data. The association between the sensor and the object does not generally require a specific orientation, and thus it can be easy to couple the sensor to the object without having to place it at a specific location with a specific orientation in order to achieve accurate results. In instances in which the data is to be shared on one or more networks, the user can also take action to connect the sensor and/or the device on which the control or mobile application is downloaded to a network so that data can be shared.

In addition to recording information and data associated with a specific use, other information and programming can be available to the user by way of the control or mobile application. For example, various training modules and/or games can be associated with the control or mobile application such that the data generated by the user can be used in conjunction with such module and/or games. The modules and/or games can be tailored to a user based on his or her skill level. The modules and games that are activated by the control or mobile application can be based on the type of use, mode, or stage selected by the user. By way of non-limiting examples, the learning modules and games used when the system is being used in a baseball mode may be different than the learning modules and games used when the system is being used in a lacrosse mode. Likewise, the learning modules and games used when the system is being used in a non-putting stage can be different than the learning modules and games used when the system is being used in a putting stage.

Inertial Measurement Unit (IMU)

Figure 1C:
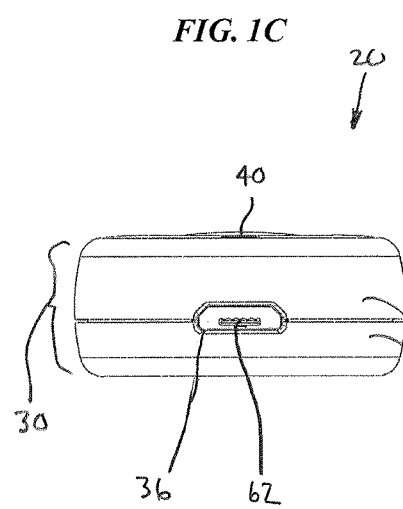
FIG. 1C is a side view of the sensor of FIG. 1A.
Figure 1D:
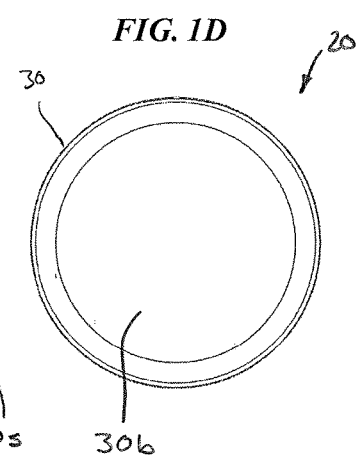
FIG. 1D is a bottom view of the sensor of FIG. 1A.
Figure 2:
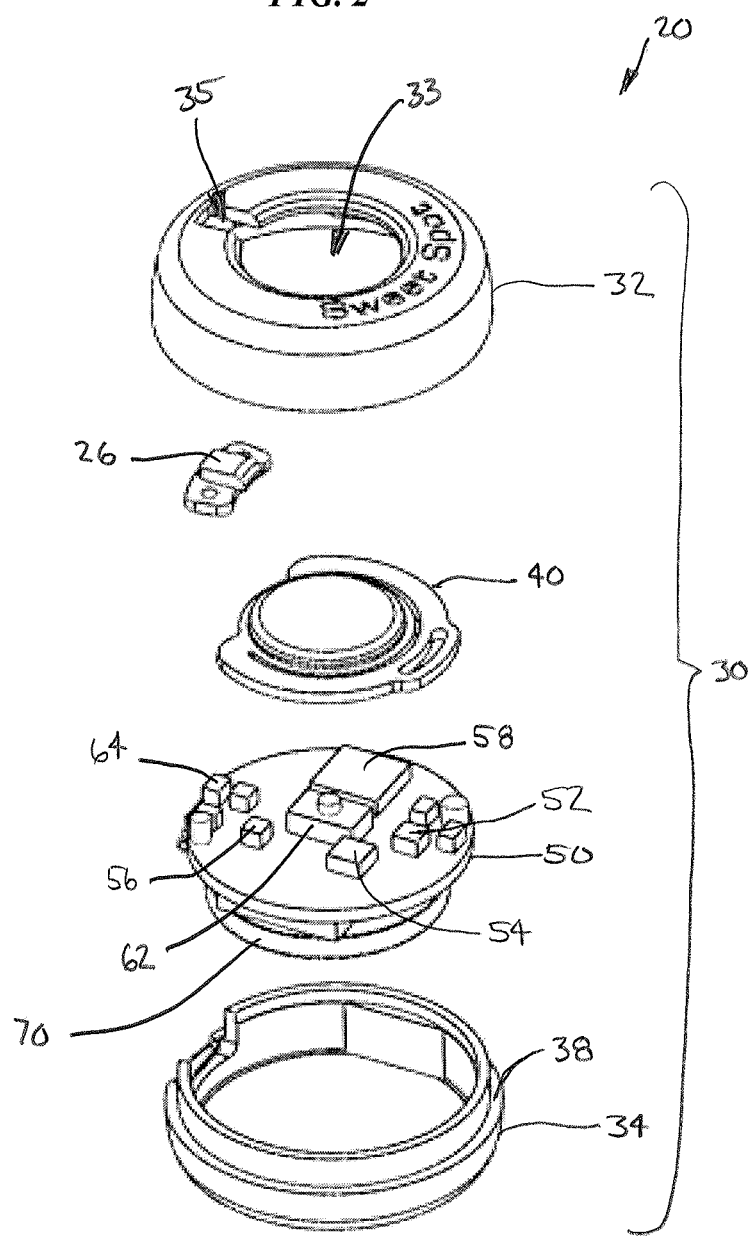
FIG. 2 is an exploded view of the sensor of FIG. 1A, the sensor including a printed circuit assembly disposed therein.

One exemplary embodiment of a sensor 20 for use in recording and transmitting data is provided for in FIGS. 1A-2. As shown, the sensor 20, sometimes referred to as an inertial measurement unit or IMU, has a circular shape, and it includes a housing 30 within which electronics and a power source are disposed to provide the enhanced functionality described herein. A push button 40 can be accessible through a top portion of the housing 30, which can be used to turn the sensor 20 ON and OFF and/or to cycle the sensor 20 through various modes of use. The modes of use can be viewed on a control or mobile application associated with the sensor 20.

An LED light pipe 26 can also be viewable from a top surface 30*t* of the housing 30. The LED light pipe 26 can transmit light from an LED disposed within the housing 30 to indicate when the sensor 20 is ON or OFF. In some embodiments, one or more LEDs disposed within the housing 30 can be used to indicate various modes of operation, such as having different colors to signify different modes, and the LED light pipe 26 can display those different colors to the user so the user knows the selected mode of the sensor 20.

As shown in FIG. 1C, a port 36 can be provided in a sidewall 30*s* of the housing 30 to provide access to an electrical connection 62 through which a power source disposed within the housing 30 can be powered and/or recharged. The port 36 can be sized and shaped to receive a number of different wires that can assist in the powering and/or recharging process.

A bottom surface 30*b* of the housing 30, illustrated in FIG. 1D, can be configured to integrate with an object to which the sensor is to be attached, e.g., a swinging device or a prosthetic, or to integrate with an intermediary component that facilitates the attachment of the sensor to the object, the intermediary component being, for example, an adaptor or sleeve, as described in greater detail below.

FIG. 2 provides a more detailed view of the various components of this non-limiting embodiment of a sensor. As shown, upper and lower housings 32, 34 that define the top and bottom surfaces of the sensor 20, respectively, can be configured to mate together to encapsulate or encase the other components of the sensor. Any number of techniques can be used to mate the two housings 32, 34 together, including but not limited to any form of a male-female connection, a snap fit, a threaded fit, a weld, or an adhesive bond. In the illustrated embodiment, the lower housing 34 includes a lip 38 formed thereon that is adapted to snap fit with a corresponding side wall (not visible) of the upper housing 32 to form a fluid impervious seal between the two housings. The housings 32, 34 can be configured to be disconnected, for instance to allow for a power source or other components disposed therein to be repaired and/or replaced. In some embodiments, one or more intermediary connection elements and/or gaskets can be disposed between the upper and lower housings 32, 34 to assist in mating the two components together while maintaining a fluid impervious seal such that the electronics and other components disposed within the housing 30 are sealed from damage that can occur due to conditions associated with an outside environment.

In the illustrated embodiment, the housing 30, and thus the upper and lower housings 32, 34, is generally circular in shape, although other shapes are possible, depending, at least in part, on the size and shape of the other components with which the housing is used, the size and shape of the object to which the housing is attached and/or the intermediary component used to mount the housing to the object, and the desired use of the sensor. A variety of materials can be used to form the housing, including polymers, plastics, and the like. In some exemplary embodiments, the housing is made of polycarbonate or acrylonitrile butadiene styrene (ABS).

A printed circuit board (PCB) 50, sometimes referred to as a printed circuit assembly (PCA), is disposed within the fluid impervious housing 30. The PCB 50 can be made of a non-conductive substrate and can include a variety of components used to operate the sensor 20 and related control or mobile application, including but not limited to an accelerometer 52, a gyroscope 54, a magnetometer 56, a microcontroller 58, and a Bluetooth Low Energy radio component 60. These components are described in greater detail below. As shown, the PCB 50 can also include an ON/OFF button or switch 62, and one or more LED diodes 64 to indicate whether the sensor is ON or OFF and/or to indicate various modes associated with the sensor 20 if so configured.

Disposed between the PCB 50 and the upper housing 32 are the button cover 40 and the LED light pipe 26. The button cover 40 integrates with the upper housing to protect the components of the PCB 50 from the outside environment. More particularly, an opening 33 is provided in the upper housing 32 in which the button cover 40 sits. The button cover 40 also provides for easy access to the switch 62 disposed on the PCB 50 so the sensor 20 can be easily turned ON or OFF or have various modes cycled through. As shown in FIG. 1C, in some embodiments a central portion of the button 40 can protrude above the upper housing 32 to make it easy for a user to find and push the button during use of the system as a whole. The button cover 40 can be made from a variety of materials, and it can be made from the same or different materials as the upper and lower housings. In some exemplary embodiments, the button cover 40 is made from polymers, plastics, and the like. In some exemplary embodiments, the button cover 40 is made of polycarbonate or ABS. The button cover 40 can have a variety of shapes, depending, at least in part, on the configuration of the electrical components disposed on the PCG 50.

Similar to the button cover 40, the light pipe 26 integrates with the upper housing 32 to protect the components of the PCB 50, including one or more LED diodes 64 disposed on the PCB 50, from the outside environment. The light pipe 26 sits within a channel 35 formed in the upper housing 30 to receive the light pipe 26. The light pipe 26 is adapted to transport or otherwise distribute the light from the LED diode(s) 64 to the outside environment. Accordingly, the light pipe 26 can be transparent or clear to allow light to shine therethrough. A variety of materials can be used to form the light pipe 26, including but not limited to polymers, plastics, and the like. In some exemplary embodiments, the light pipe 26 is made of polycarbonate or ABS.

A power source 70, as shown a battery, can be provided within the housing 30. In the illustrated embodiment, the power source 70 is electrically coupled to and disposed below the PCB 50, although a person having skill in the art will recognize a variety of other configurations that can be used to provide power to the PCB 50 and its components. Likewise, a person having skill in the art will recognize that a variety of different batteries or other power sources can be used to power the sensor 20 and its components, however, in the illustrated embodiment the battery is a lithium CR2032 battery.

Main Components of the IMU

Figure 3:
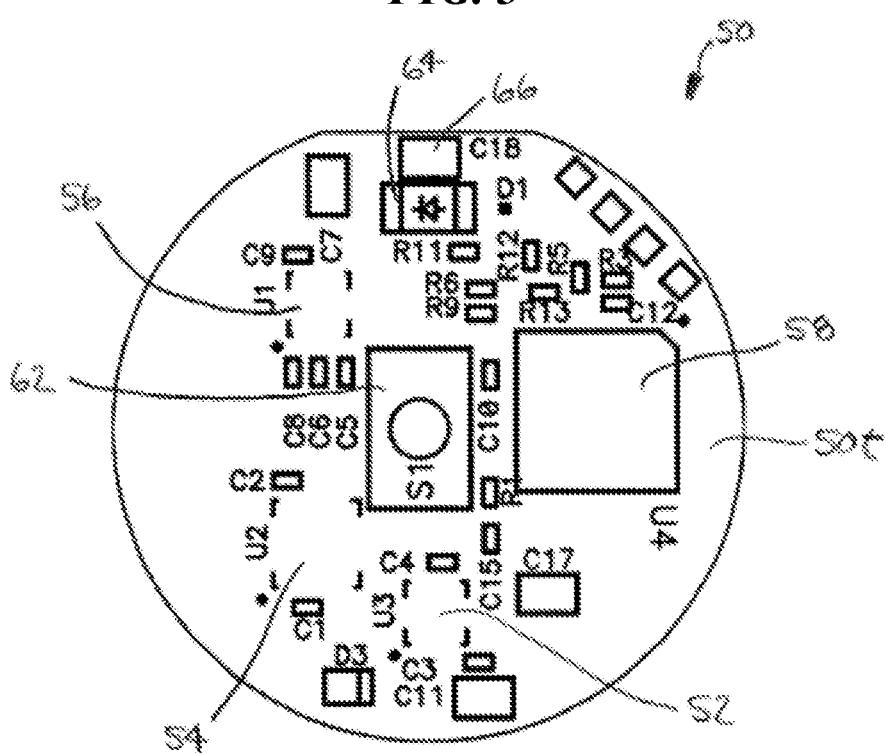
FIG. 3 is a schematic top view of the printed circuit assembly of FIG. 2.

FIGS. 3-5D, and the related descriptions, provide more particular information about the electrical components of the system that provide the functionality of the IMU 20. As shown in FIG. 3, the main components of the IMU 20 disposed on or otherwise associated with a top surface 50t of the substrate include the accelerometer 52, the gyroscope 54, the magnetometer 56, the microcontroller 58, the switch or button 62, and the one or more LED diodes 64. A person having skill in the art may sometimes refer to components such as the accelerometer 52, the gyroscope 54, and the magnetometer 56 as sensors, or sub-sensors of the main sensor or IMU 20. As shown, resistors (labeled with Rs), capacitors (labeled with Cs), and one or more metal clips 66 to engage the power source 70 are also provided on the top surface 50t of the substrate. A person having skill in the art will recognize that the illustrated configuration of the top surface 50t is merely one, non-limiting example of ways by which the main components, resistors, capacitors, and metal clips can be configured on the substrate, and that any number of configurations are possible without departing from the spirit of the present disclosure.

The accelerometer 52 can measure accelerations and gravity associated with the sensor 20 and the object to which the sensor is attached. As described herein, the accelerometer 52 can be used to compute positions over a short period of time. In one exemplary embodiment, the accelerometer 52 is a tri-axial accelerometer distributed as the Bosch Sensortec BMA250 by Bosch Sensortec GmbH, Gerhard-Kindler-Straße 9, 72770 Reutlingen/Kusterdingen GERMANY. Other brands and/or models can also be used. The parameters of the provided for accelerometer 52 include having a measurement range of about +/−16 g, a minimum resolution of approximately 0.0039 g, a max sampling rate of approximately 1 kHz, and a data format that is 10 bit binary.

The gyroscope 54 can directly measure rotational velocity, and it can be used to compute a magnitude of rotation. In one exemplary embodiment, the gyroscope 54 is a tri-axial gyroscope distributed as the Bosch Sensortec BMG160 by Bosch Sensortec GmbH. Other brands and/or models can be used. The parameters of the provided for gyroscope 54 include having a measurement range of approximately +/−2000°/s, a minimum resolution of approximately 0.0038°/s, a maximum sampling rate of approximately 2 kHz, and a data format that is 16 bit binary.

The magnetometer 56 can directly measure the Earth's magnetic field, similar to a compass, and it can be used as an absolute angular reference. In one exemplary embodiment, the magnetometer 56 is a tri-axial magnetometer distributed as the Freescale High Accuracy, 3D Magnetometer MAG3110 by Freescale Semiconductor Inc., 6501 William Cannon Drive West, Austin, Tex. 78735. Other brands and/or models can be used. The parameters of the provided for magnetometer 56 include having a measurement range of approximately +/−1 mTesla, a minimum resolution of approximately 0.1 µTesla, a maximum sampling rate or approximately 80 Hz, and a data format that is 16 bit binary.

The microcontroller 58 can be used to operate the sensor 20, and more particularly the components such as the accelerometer 52, the gyroscope 54, the magnetometer 56, and the Bluetooth Low Energy radio component 60. The microcontroller 58 can adjusted to seamlessly move between different pre-stored uses, modules, or stages (described in greater detail below) so that the IMU 20 can be used for different functionalities across different fields or uses (e.g., sports, medical), different specialties within those fields, referred to herein as modules or contexts (e.g., golf and tennis in the field of sports), and different stages within a single field or module (e.g., different types of swings in a sport, such as a regular batting swing and a bunt). Such adjustments, even if referred to as programming or reprogramming, are quite different than existing devices and systems, which would require a full-scale reprogramming over a long period of time in order to adapt a sensor for different uses. In the present application, a described in greater detail below, any "reprogramming" occurs in a matter of seconds or less. In one exemplary embodiment, the microcontroller 58 is an integrated, ultra low power mixed signal microcontroller circuit distributed as the Texas Instruments MSP430G2755 by Texas Instruments, 12500 TI Boulevard, Dallas, Tex. 75243. Other brands and/or models can be used. The parameters of the provided for microcontroller 58 include having a processing speed of approximately 16 MHz, a word size that is 16-bit, a number of I/O that is 32, a flash memory size of 32 KB, and a RAM size of 4 KB.

The switch or button 62 can be used to turn the sensor ON and OFF. For example, a user can depress the button 62, which in turn can close a circuit to allow the sensor 20 to power on for a given period of time. In some exemplary embodiments, powering the sensor 20 on via the button 62, via the button cover 40 (FIG. 2), can turn the sensor 20 on for a set period of time, e.g., one hour, before powering down. Accordingly, a user can turn on the sensor 20, go about his or her business (e.g., warming up, stretching, checking in for a tee time, etc.), and then can begin using the sensor without later having to remember to turn it on. In some instances, data transmission when in use can be enough to continue to keep the sensor 20 on for a given time period. As such, in those embodiments the sensor 20 only needs to be turned on once before an 18 hole round of golf begins. In some instances the sensor 20 can be configured to automatically turn off after a period of time, such as longer than an hour of non-use, to conserve energy.

In some embodiments, the switch 62 can cycle through more than just an "ON" mode and an "OFF" mode. For example, when the sensor 20 is used in a golf application, the switch 62 can be used to cycle between three stages: (1) one for a non-putter swing; (2) one for a putter swing; and (3) an OFF position. In other embodiments, a control application associated with the sensor can be used to cycle between different stages (e.g., a non-putter swing and a putter swing) while the switch 62 only controls whether the sensor 20 is ON or OFF. Likewise, while a control application can also be used to cycle the sensor 20 between different uses, modes, or stages, in some embodiments the switch or button 62 can be used to cycle through two or more different uses, modes, or stages.

In one exemplary embodiment, the switch 62 is a tactile switch often used in mobile devices and smaller consumer electronic products, the switch 62 being distributed as the C&K Components KSR251GLFS by C&K Components, 15 Riverdale Avenue, Newton, Mass. 02458. Other brands and/or models can be used. The parameters of the switch 62 include having an operating force of about 4.5 N, a current rating of 50 mA, a voltage rating DC of 32V, and a power rating of 1 VA. The switch function of the C&K Components KSR251GLFS is only "ON-OFF," and thus in that exemplary embodiment, the switch 62 is only used to turn the sensor 20 ON and OFF and not to cycle through uses, modes, or stages.

The one or more LED diodes 64 can be used to signal that the switch 62 is in the ON or OFF position. In embodiments in which the switch 62 is used to provide additional functionality, such as changing between different uses, modes, or stages, the one or more LED diodes 64 can also provide signals that distinguish between the different uses, modes, or stages. Even in embodiments in which only the control application switches the uses, modes, or stages of the sensor 20, the one or more LED diodes 64 can be configured to signal which use, mode, or stage is active, for instance by activating one or more of the diodes 64 in different combinations, using different colors, or using different flashing/non-flashing patterns. In some embodiments, the one or more LED diodes 64 is a single diode configured to be ON when the sensor 20 is ON and OFF when the sensor 20 is OFF. In one exemplary embodiment, the LED diode 64 is distributed as the Vishay VLMS20 by Vishay Intertechnology, Inc., 63 Lancaster Avenue, Malvern, Pa. 19355-2143. Other brands and/or models can be used. The parameters of the LED diode 64 is that it is a single super red light having a wavelength of approximately 630 nm, a typical forward voltage of about 1.8 V, and a maximum voltage of about 2.2 V.

Figure 4A:
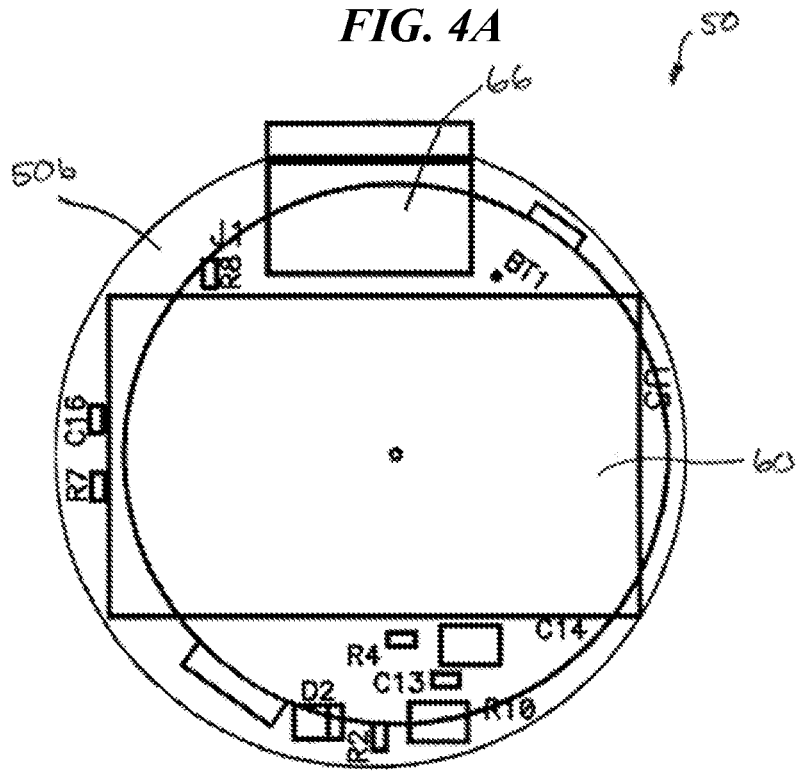
FIG. 4A is a schematic bottom view of the printed circuit assembly of FIG. 2.

A bottom surface 50b of the substrate is illustrated in FIG. 4A. The main component disposed on or otherwise associated with the bottom surface of the substrate is the Bluetooth Low Energy radio component 60. Like the top surface 50t, the bottom surface 50b also includes resistors (labeled with Rs), capacitors (labeled with Cs), and one or more metal clips 66 to engage the power source 70, and the illustrated embodiment is merely one, non-limiting embodiment of a configuration of the bottom surface 50b. In fact, a person skilled in the art will recognize that various components of the top and bottom surfaces 50t, 50b can be interchangeably disposed on the other surface if desired. Any number of configurations of the top surface 50t and bottom surface 50b is possible without departing from the spirit of the present disclosure.

The Bluetooth Low Energy radio component 60 can provide wireless communication radio on a 2.4 GHz bandwidth utilizing Bluetooth 4.0, also known as "Bluetooth Low Energy," communication protocol. More particularly, the Bluetooth Low Energy radio component 60 can be used to communicate data from the sensor 20 to a mobile or control application, gateway (described in greater detail below), or other device or location configured to receive data from the sensor 20. The Bluetooth Low Energy radio component 60 can also be used to communicate operational instructions from the mobile or control application or other remote programming device or method to the sensor 20. In one exemplary embodiment, the Bluetooth Low Energy radio component 60 is distributed as the Anaren A2541 module by Anaren, Inc., 6635 Kirkville Road, East Syracuse, N.Y. 13057. Other brands and/or models can be used. The parameters of the provided for Bluetooth Low Energy radio component 60 include having an operation frequency of approximately 2.4 GHz, a maximum data rate of approximately 2 Mbps, and current consumption of approximately 14 mA in the active mode RX, and approximately 13 mA in the active mode TX.

Figure 4B:
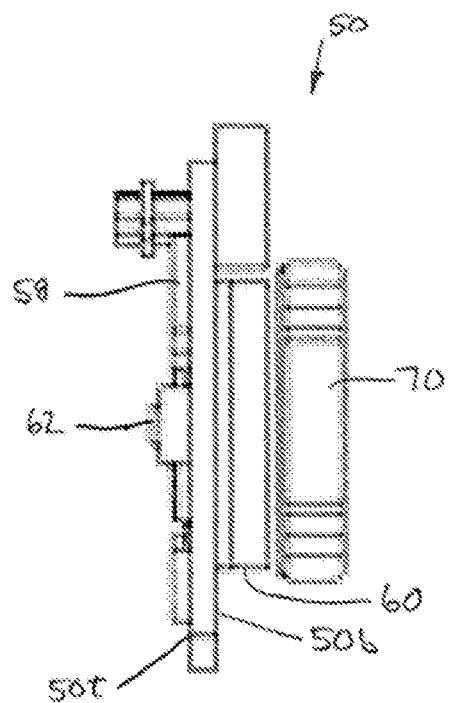
FIG. 4B is a side view of the printed circuit assembly of FIG. 2.
Figure 5A:
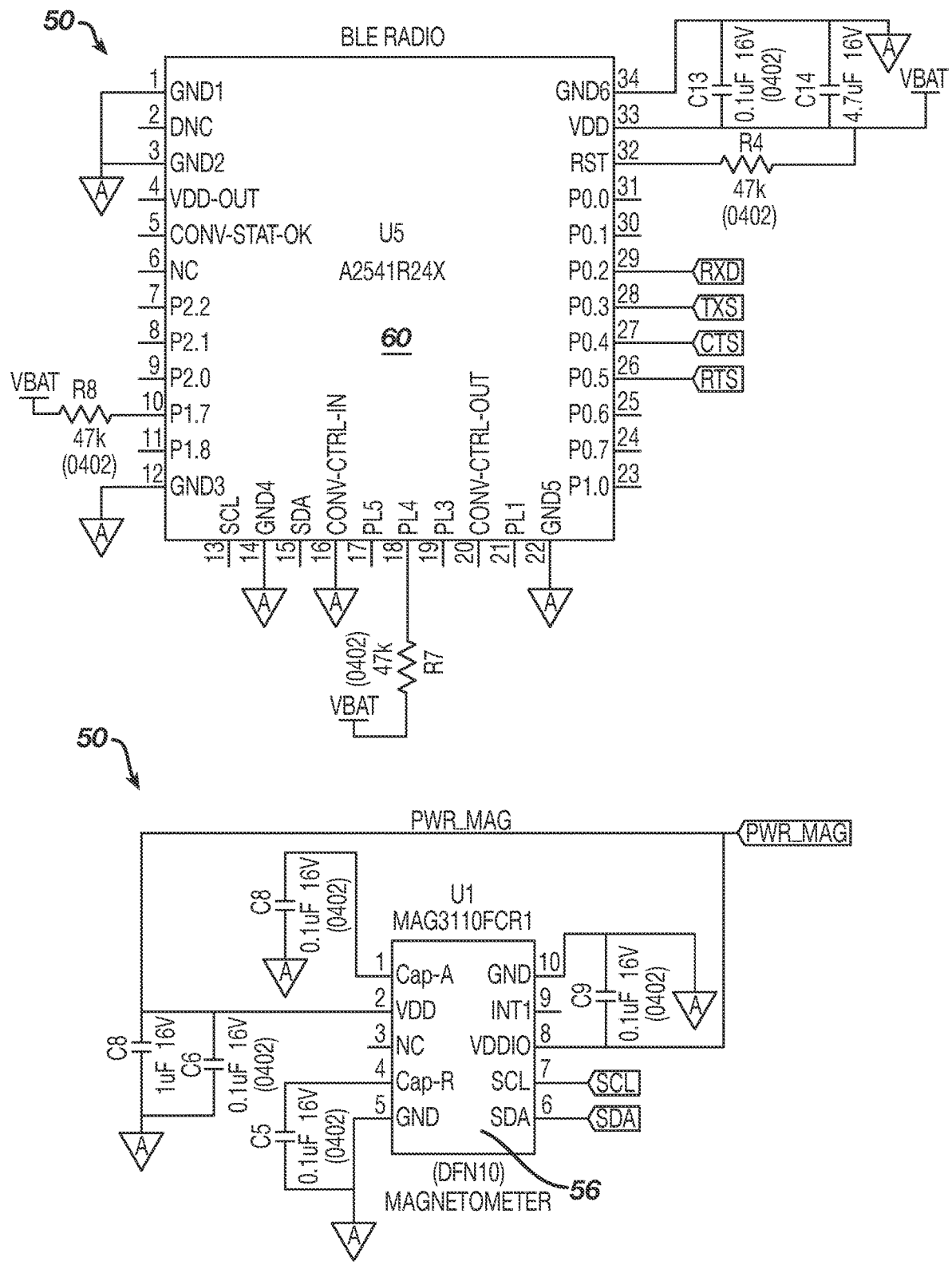
FIGS. 5A-5D provide a schematic view of the electrical circuits of the printed circuit assembly of FIG. 2.
Figure 5B:
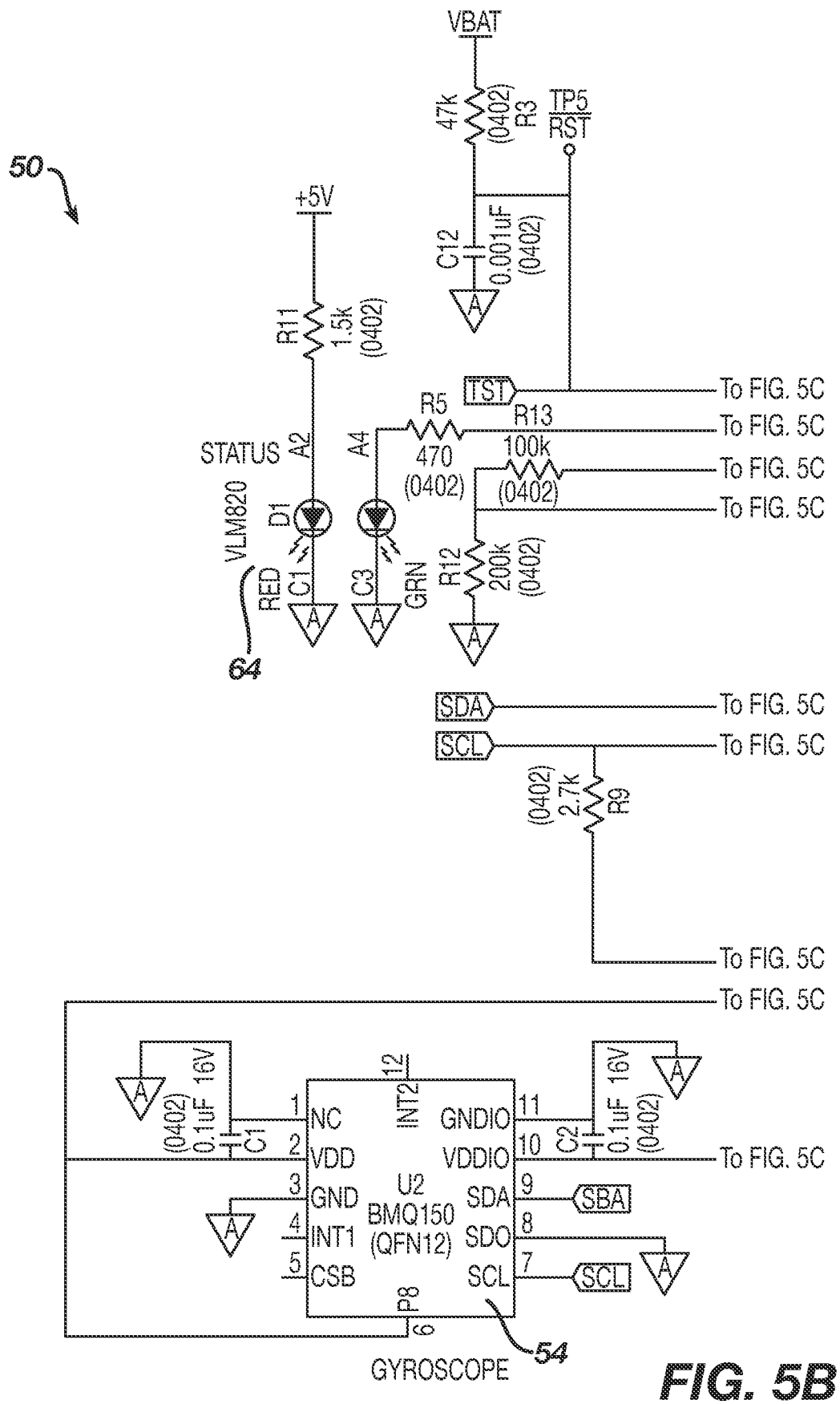
Figure 5C:
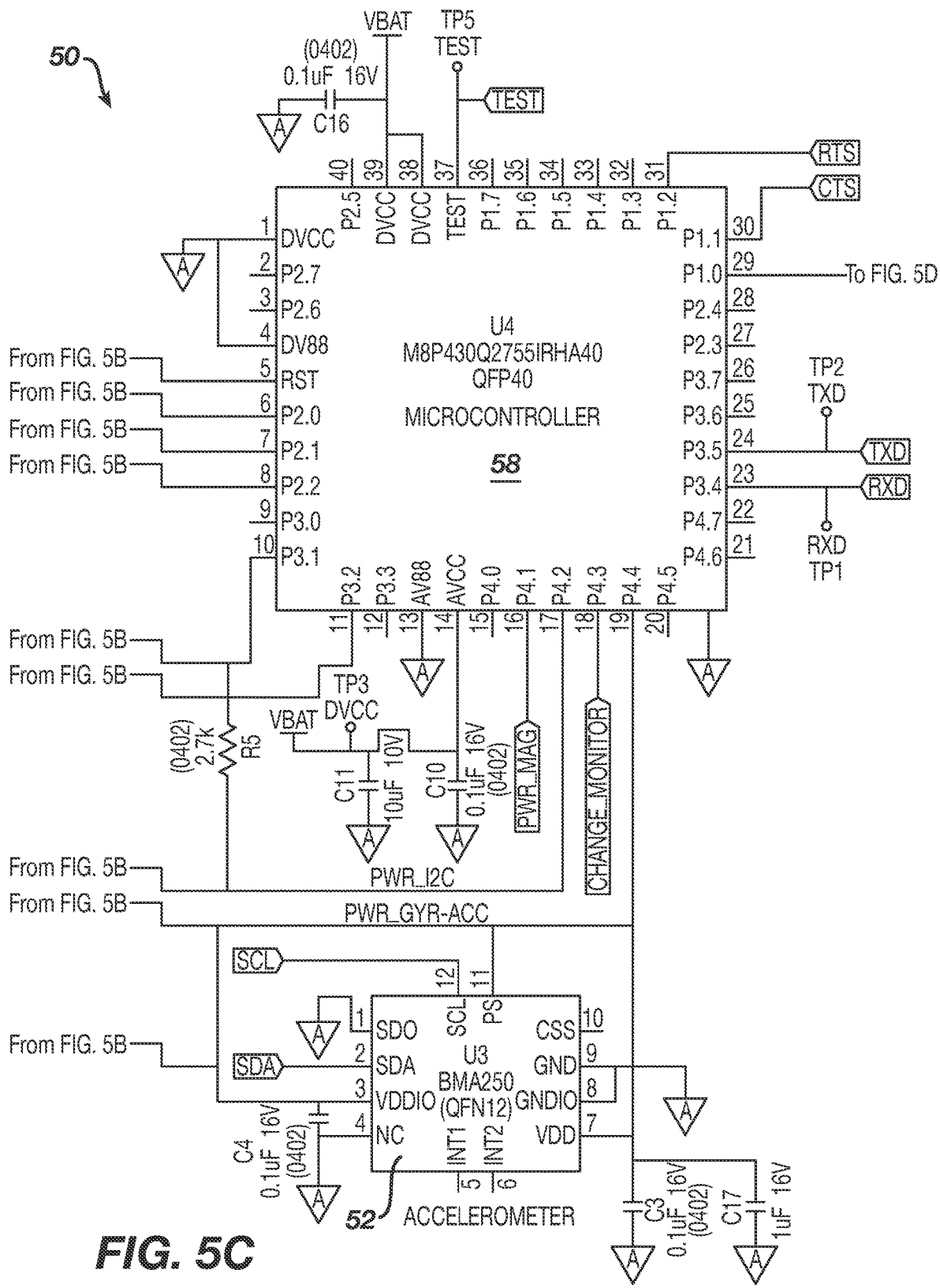
Figure 5D:
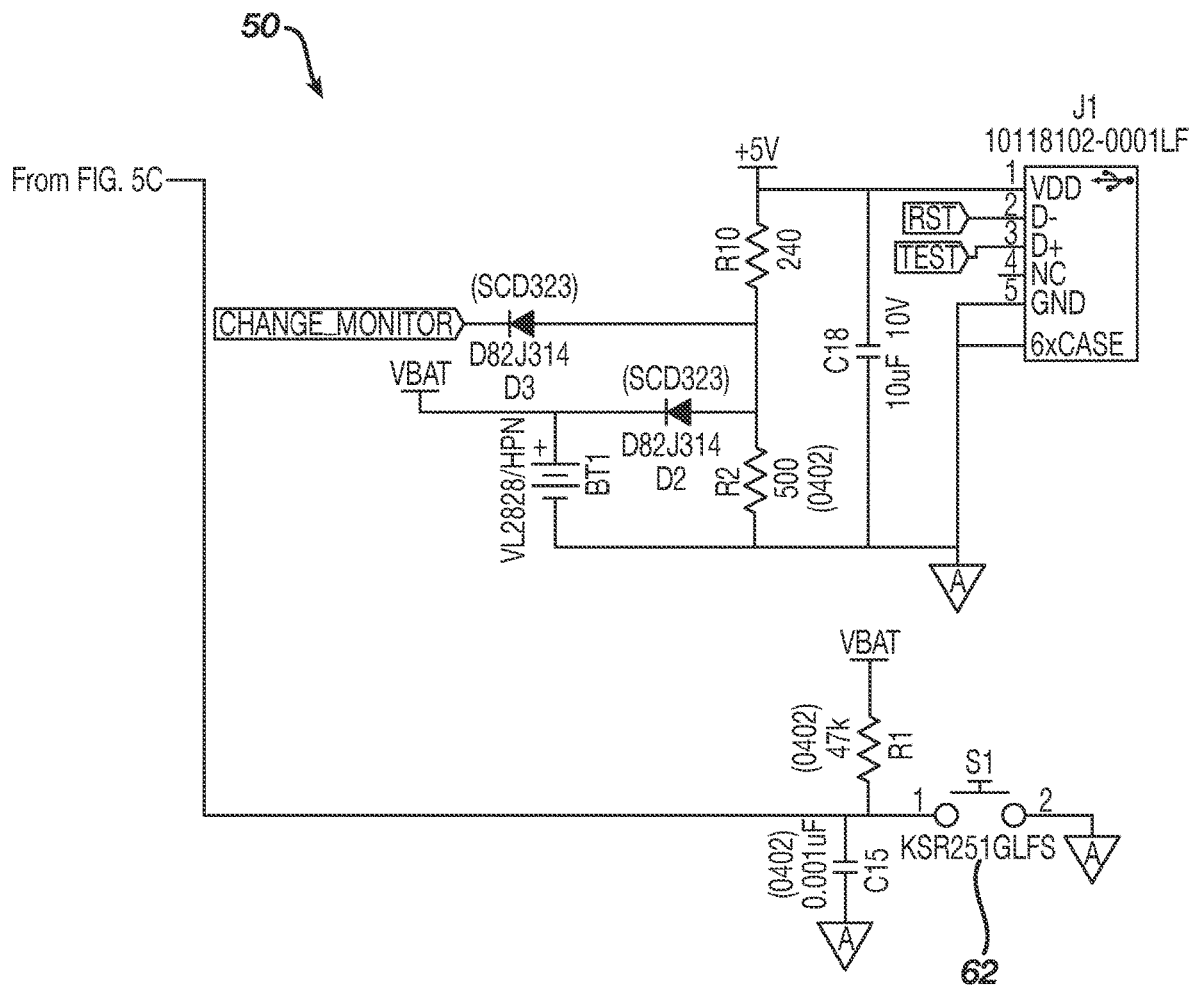

FIG. 4B illustrates the PCB 50 in contact with the power source 70. Disposed on the top surface 50t of the PCB 50, although not all visible in FIG. 4B is the microcontroller 58, switch 62, LED diode 64, magnetometer 56, gyroscope 54, and accelerometer 52, while the Bluetooth Low Energy radio component 60 is disposed proximate to the bottom surface 50b of the PCB 50. The power source 70 is disposed below the Bluetooth Low Energy radio component 60 when an orientation of the sensor 20 is such that the top surface 50t faces upwards.

FIGS. 5A-5D provide schematic diagrams of the circuitry associated with the PCB 50 and related components. Circuitry associated with each of the microcontroller 58, switch 62, LED diode 64, magnetometer 56, gyroscope 54, accelerometer 52, and Bluetooth Low Energy radio component 60 are provided. A person skilled in the art will understand how to read these diagrams, and further will understand that the illustrated diagrams are just one embodiment of many that can be used to operate the various components of the IMU 20.

Overall, the system defined at least in part by the IMU 20 is designed to accurately capture short, rapid movements. More particularly, the movements can occur in a time range of approximately 0.3 seconds to approximately 30 seconds, and further, motions can be greater than 50 times the minimum detectable acceleration and/or rotational velocity of the accelerometer 52 and gyroscope 54, respectively. In some embodiments, the speed at which measurements are performed can depend, at least in part, on the temporal resolution required, that is what is the shortest timescale to be measured, a determination of which sensors (e.g., the accelerometer 52, magnetometer 56, and gyroscope 54) are needed for a particular measurement, and a determination of the available RAM of the microcontroller 58, which can be approximately 3 kB. While the size and shape of the IMU 20 can depend on a variety of factors, including but not limited to the components with which it is used and the components disposed therein, in some embodiments it can have a diameter approximately in the range of about 0.5 inches to about 10 inches and a weight approximately in the range of about 10 grams to about 2000 grams. In one exemplary embodiment, the IMU 20 is approximately circular in shape, has a diameter of approximately 1 inch, and weighs about 18 grams. In embodiments in which a non-circular shape is involved, a person having skill in the art will recognize how the number related to the diameter can be transposed into relevant length and width parameters. A thickness of the IMU 20 can be in the range of approximately 0.1 inches to about 3 inches, and in one exemplary embodiment can be approximately 0.4 inches.

The IMU 20, on its own or in conjunction with the control application, can be designed to record or otherwise determine a variety of data about a user's golf swing, including but not limited to a swing plane, a location of impact, a club head speed, an angle at which the ball is struck by the club head, a swing temp, a length of time of a backswing, a length of time of a forward swing, a total swing time, an amount of wrist rotation, an estimated distance a struck ball travels, and an estimated direction in which a struck ball travels. This data can be used to track various types of information, map a user's swing, receive instructions from or otherwise analyze the swing as part of a learning module, and/or play a game. A person skilled in the art will recognize other types of data that can be recorded or otherwise determined for a golf swing based on the various components of the PCB 50.

Likewise, a person skilled in the art will also recognize types of data that can be recorded or otherwise determined for other sports (e.g., baseball, tennis, lacrosse, hockey, billiards, badminton, squash, racquetball, table tennis, etc.) or uses (e.g., prosthetics). By way of non-limiting examples, data that can be recorded for a baseball swing includes a swing plane, a location of impact, a bat head speed, and angle at which the ball is struck by the bat, a time of the strike, a total swing time, an amount of wrist rotation, an estimated distance a struck ball travels, and an estimated direction in which a struck ball travels. By way of further non-limiting examples, data that can be recorded for a lacrosse swing includes a swing plane, a location of release, a stick head speed, a type of swing, a time at which the ball is released, a total swing time, an amount of wrist rotation, an estimated distance a released ball travels, and an estimated direction in which a released ball travels. Still further, the types of data that can be recorded for use in prosthetics includes a number of steps taken per day for feet, a number of back-and-forth motions taken per day for arms, a distribution of time for various activities over the course of a day (e.g., time spent running, walking, sitting, etc.), the amount of time it takes to put a prosthetic on (sometimes referred to as a donning time), the amount of time it takes to put a prosthetic away (sometimes referred to as doffing time), a gait motion analysis (which typically uses two or more sensors), tension, and joint angles.

Attachment of IMU to an Object

The IMU or sensor 20 can be used in conjunction with a variety of objects, including swinging devices such as a golf club 100 illustrated in FIGS. 6A-7B, as well as other objects outside of the athletic context, such as prosthetics. In the illustrated embodiment, an adaptor or sleeve 110 is used to integrate the sensor 20 with the golf club 100.

Figure 7A:
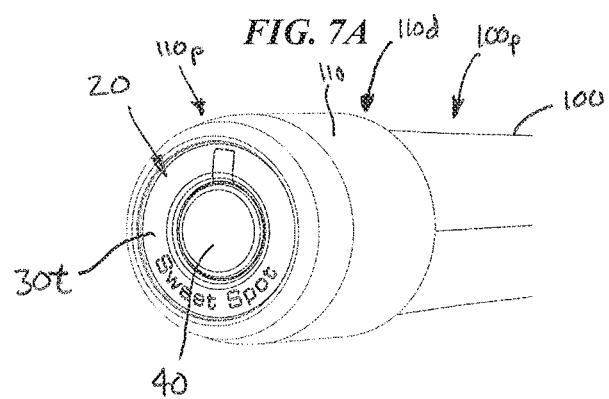
FIG. 7A is a perspective side view of the sensor, adaptor, and handle of FIG. 6A.
Figure 7B:
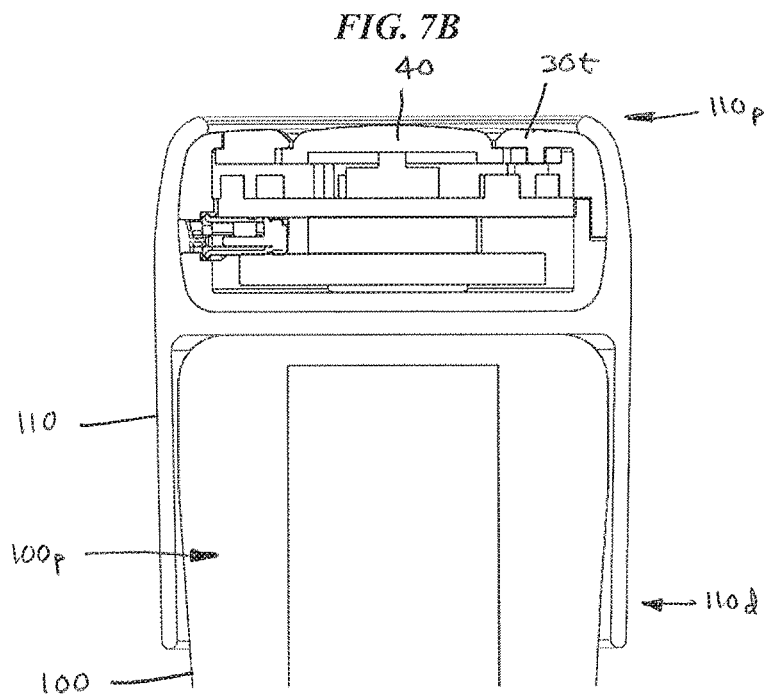
FIG. 7B is a cross-sectional side view of the sensor, adaptor, and handle of FIG. 7B taken along the line B-B.

As shown, the adaptor 110 is a cylindrical, hollow sleeve having a size and shape conducive to having a distal end 110*d* thereof securely fastened to a proximal end 110*p* of the club. A proximal end 110*p* of the adaptor 110 can be configured to receive the sensor 20 such that the sensor is securely fastened to the adaptor, and thus the proximal end 100*p* of the club 100. As shown in FIG. 7B, the orientation of the IMU 20 is such that the top surface 30*t* of the housing 30 and a top surface of the button cover 40 are disposed proximal of the lower housing 34 and the components disposed within the housing 30 (e.g., the microcontroller 58, magnetometer 56, accelerometer 52, gyroscope 54, switch 62, LED diode 64, Bluetooth Low Energy radio component 60, and power source 70) such that a user can push the button cover 40 to activate and deactivate the switch 62.

In the illustrated embodiment, the adaptor 110 is made of an elastomeric material that allows it to create the secure fastens on each end 110*p*, 110*d*, although a person skilled in the art will recognize a variety of other ways by which the adaptor 110 can be attached to the club 100 and the sensor 20 can be attached to the adaptor 110. Any techniques known for coupling two components can be used, including a male-female configuration, a stretch-fit configuration, a snap-fit configuration, and a threaded configuration. Some exemplary materials that can be used for the adaptor 110 include thermoplastic polyurethane (TPU), thermoplastic elastomer (TPE), silicone, rubber, or other elastomeric polymer or foaming polyurethane.

Figure 8:
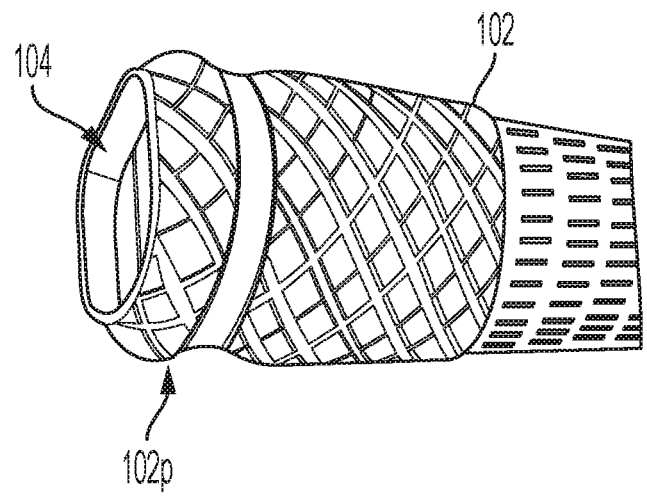
FIG. 8 is a side perspective view of one exemplary embodiment of a grip of a swinging device configured to receive a sensor like the sensor of FIG. 1A.

In some embodiments, such as the one provided for in FIG. 8, an intermediary device such as an adaptor can be eliminated and grips 102 of a swinging device can be specifically designed to receive an IMU. For example, a proximal end 102*p* of the grip 102 can include an opening 104 defined by a portion of the grip 102 that has elastomeric properties or the like. The opening 104 can be adapted to receive the IMU such that the sensor is securely fastened to the grip 102, and thus the swinging device. In other embodiments, the sensor can be disposed within the confines of the grip on a more permanent basis, which can be useful for a swinging device that is used exclusively as a training tool, for example.

An alternative embodiment of an adaptor or sleeve 110' is provided for in FIGS. 9A and 9B. As shown, the adaptor 110' has a distal end 110*d'* that is configured to mate with a proximal end 100*p'* of a golf club 100' by way of a snap-fit, and a proximal end 110*p'* that is configured to receive a sensor or IMU 20'. The illustrated sensor 20' has a slightly different shape than the previously described sensor 20, but it can generally include the same components disposed therein and it can generally have the same functionality. The proximal end 110*p'* of the adaptor 110' can include a cavity 114' in which the sensor 20' can be slidably received and securely fastened within, thereby securing the location of the sensor 20' with respect to the golf club 100'.

Figure 10:
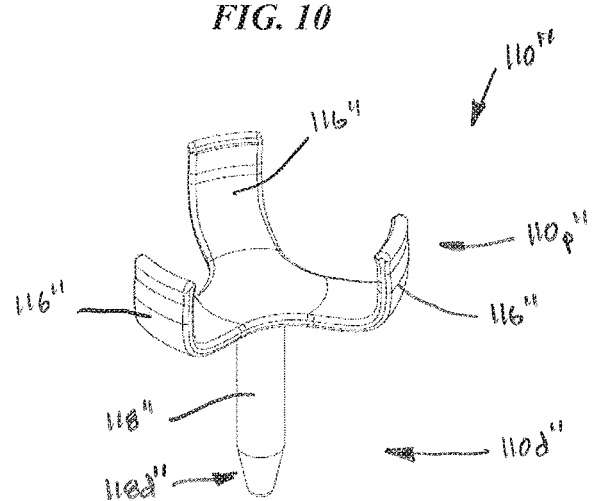
FIG. 10 is a perspective view of yet another exemplary embodiment of an adaptor configured to receive a sensor like the sensor of FIG. 1A and configured to be coupled to a handle of a singing device.

FIG. 10 provides still a further embodiment of an adaptor 110" for use with sensors of the nature provided for herein, including the sensor 20. As shown, the adaptor 110" includes a proximal end 110*p"* configured to receive a sensor, and a distal end 110*d"* configured to mate to an object, such as a proximal end of a golf club. More particularly, the proximal end 110*p"* can include a plurality of pliable arms 116" that are configured to snap fit around an appropriately sized sensor to secure the location of the sensor with respect to the arms 116". In the illustrated embodiment three arms 116" are used to secure a sensor, although in other embodiments, fewer or more arms can be used, including a single arm that can engage an opening formed in the sensor for coupling with the single arm, similar to the engagement mechanism described below with respect to the distal end 110*d"* of the adaptor 110".

The distal end 110*d'''* of the adaptor 110" includes a single, distally extending arm 118". The arm 118" can be configured to be disposed within an opening formed in a proximal end of a golf club. Further, as shown, the arm 118" can include a chamfered distal end 118*d'''* to facilitate the insertion of the distally extending arm 118" into the opening.

A person having skill in the art will recognize that adaptors, or grips in embodiments in which the intermediary adaptor or sleeve is eliminated, can have other sizes, shapes, and configurations depending on the object with which they are used to associate the IMU with the object. Such changes to adaptors are within the scope of the present disclosure. For example, an adaptor used to fasten or couple the sensor to a golf club typically has a different configuration than an adaptor used to fasten or couple the sensor to a tennis racket because the gripping end of a tennis racket is typically wider and of a different shape (typically circular for a golf club and typically octagonal for a tennis racket). Further, although the illustrated embodiments primarily describe adaptors for use with swinging devices such as golf clubs, a person having skill in the art will recognize how to configure adaptors for use in coupling or fastening the IMU to other types of objects, such as prosthetics, without departing from the spirit of the present disclosure. In some embodiments, sensors can be fastened directly to another object without using an adaptor.

Operation of IMU—Omni-Directional

The IMU 20 can be operated in a plug-and-play manner. A user merely secures the IMU 20 to the object for which data is desired, downloads a control application to use in conjunction with the IMU, and begins to use the IMU and control application to generate and transmit data.

The attachment of the IMU 20 to an object, such as a swinging device, is easy because there is no need to orient the IMU in a particular manner with respect to the object. This is because the IMU 20 is configured to be omni-directional. The algorithms implemented in the IMU 20 and control application allow for the IMU to being oriented anywhere in a 360° range with respect to the object to which it is attached.

Figure 11:
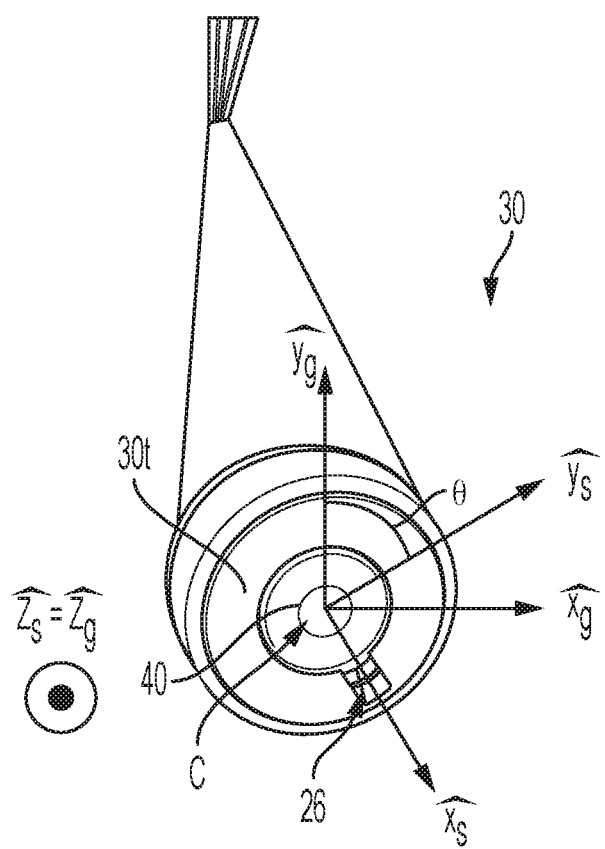
FIG. 11 is a schematic perspective view of the sensor of FIG. 1A, illustrating a coordinate system of the sensor and a coordinate system of an object to which the sensor can be coupled.

More particularly, as shown in FIG. 11, the system defines two coordinate systems—a coordinate system of the IMU 20 and a coordinate system of the object, e.g., a golf club. The coordinate system of the IMU 20 can be defined by the $\hat{x}_s$, $\hat{y}_s$, and $\hat{z}_s$ axes of the gyroscope and accelerometer. As shown, the $\hat{x}_s$ axis extends from a center C of the top surface 30*t* of the housing 30 towards a defined location on the top surface 30*t*, a distance away from the center C, in this instance the LED light pipe 26. Further as shown, the $\hat{z}_s$ axis extends from the center C vertically upwards through the push button 40 such that it is approximately perpendicular to the top surface 30*t*. Still further, the $\hat{y}_s$ axis is defined by the cross product: $\hat{z}_s \times \hat{x}_s$.

The coordinate system of the object, e.g., a golf club, can be defined by the $\hat{x}_g$, $\hat{y}_g$, and $\hat{z}_g$ axes of the golf club. As shown, the $\hat{z}_g$ axis extends approximately vertically along a shaft of the golf club towards the user, in a direction similar to the direction of the $\hat{z}_s$ axis. In fact, these two z axes are automatically aligned by virtue of placing the IMU 20 upright at a proximal end of the golf club. Further, the $\hat{y}_g$ axis extends approximately parallel to a head of the golf club that is coupled to the shaft of the club and extends towards an object to be struck by the head, e.g., a golf ball. Still further, the $\hat{x}_g$ axis extends approximately perpendicular to the head of the golf club and to one side of a user of the club, for instance to the right of the user.

In view of these coordinate systems, an angle θ is defined by the $\hat{y}_s$ axis and the $\hat{y}_g$ axis. One or more algorithms that allow for the omni-directional nature of the IMU 20 determine the angle θ through analysis of the trajectory of the IMU during a golf swing. In other types of sensors, a particular type of alignment between the sensor and the object is required so that the value of the angle θ is 0. However, because the present application uses one or more autonomous and highly reliable algorithms to determine the value of the angle θ, the sensor or IMU 30 does not have to have a particular orientation with respect to the object. Two base algorithms that are each able to provide for the omni-directional nature of the IMU 20, as well as variations that can allow for improved accuracy, are described herein.

Gravity Vector Method

The first algorithm uses a gravity vector method to determine the value of the angle θ. In this method, when the golf club is held at an "address" position, described as a position next to the golf ball, before the swing commences, the value of the angle θ can be computed using the accelerometer readings of the direction of the gravity vector. An equation to compute the angle θ using the accelerometer readings can be as follows:

$$\theta = \operatorname{atan}\left(\frac{a_{xs}}{a_{ys}}\right) \quad (1)$$

in which $a_{x,s}$ is the accelerometer reading in the $\hat{x}_s$ axis direction and $a_{y,s}$ is the accelerometer reading in the $\hat{y}_s$ axis direction.

While equation 1 can enable the omni-directional capabilities of the present system, it can be limited because the equation assumes that the accelerometer is only reading inertial accelerations due to gravity. Thus, as soon as a swing commences, the physical acceleration of the sensor overcomes the inertial acceleration due to gravity and the data can become corrupted. This problem can be addressed, for example, by determining the value of the angle θ while the club is at rest in the address position, immediately preceding the commencement of the swing. However, even this approach can be prone to error in instances in which a user performs one or more small amplitude flicks of the golf club while at the address position immediately prior to commencing a full swing. These small amplitude flicks can sometimes be referred to as waggles, and they can be enough to corrupt the computation of the value of θ such that the determined value is unreliable.

Rotational Velocity Vector Method

The possible errors that can result using the gravity vector method are accounted for in the second method, referred to as a rotational velocity vector method. The instant the golf club commences a swing, a rotational velocity vector occurs about the $\hat{y}_g$ axis and is detected by the gyroscope. Accordingly, at the immediate onset of a swing, an equation for the value of the angle θ can be as follows:

$$\theta = \operatorname{atan}\left(\frac{v_{xs}}{v_{ys}}\right) + nH \quad (2)$$

in which $v_{x,s}$ is the gyroscope reading in the $\hat{x}_s$ axis direction, $v_{y,s}$ is the gyroscope reading in the $\hat{y}_s$ axis direction, and H=1 one for a right-handed swing and H=0 for a left-handed swing. While the handedness of a swing can be entered by a user manually, in an exemplary embodiment, the system determines the handedness of the user as part of the calculation of the value of the angle θ, as described in greater detail below.

While equation 2, like equation 1, can also enable the omni-directional capabilities of the present system, the inclusion of some additional parameters to the equation can enhance the accuracy of the equation. For example, it can be difficult to accurately measure the rotation vector from only a single gyroscope reading. Further, there is not necessarily a certain means for the algorithm to guarantee that a particular gyroscope reading is truly the commencement of a swing rather than a minor repositioning of the club or waggle prior to commencing the full swing. Accordingly, the value of the angle θ can be solved using a set of several gyroscope readings, as follows:

$$\theta = \operatorname{atan}\left(\frac{\sum_{i=1}^{N} v_{xs_i}}{\sum_{i=1}^{N} v_{ys_i}}\right) + nH \qquad (3)$$

in which $v_{x,s_i}$ and $v_{y,s_i}$ represent the $i_{th}$ recording of the gyroscope after commencing the swing in the $\hat{x}_s$ axis direction and $\hat{y}_s$ axis direction respectively. In one exemplary embodiment, the system utilizes the first twenty (20) gyroscope samples (N=20) at a sampling rate of 12 milliseconds, thus covering a span of 240 milliseconds, to determine the value of the angle θ.

Yet again, however, while equation 3, like equations 1 and 2, can enable the omni-directional capabilities of the present system, it accuracy can still be enhanced by accounting for still further parameters. Immediately after a golf swing commences, i.e., in a shorter time scale than the aforementioned 240 millisecond span, a golfer typically exhibits a wrist rotation. The wrist rotation is an effective rotation about the $\hat{z}_s$ axis, which is equivalently a rotation about the $\hat{z}_g$ axis due to the aligned z-axes in the two coordinate systems. This wrist rotation is perceptible to the gyroscope, and can thus be accounted for in a further iteration of the algorithm. In particular, the algorithm numerically integrates over the $v_{z,s}$ gyroscope readings at each time step to obtain the total rotation about the z-axis, $\phi_{z,t}$, and then rotating the $v_{x,z}$ and $v_{y,z}$ gyroscope readings by $-\phi_{z,i}$ as follows:

$$\theta = \operatorname{atan}\left(\frac{\sum_{i=1}^{N}(v_{xs_i}\cos(-\phi_{xi}) + (v_{ys_i}\sin(-\phi_{xi})))}{\sum_{i=1}^{N}(-v_{xs_i}\sin(-\phi_{xi}) + (v_{ys_i}\cos(-\phi_{xi})))}\right) + nH \qquad (4)$$

in which $\phi_{z,i} = T_s \sum_{j=1}^{i} v_{z,sj}$ and $T_s$ is a sampling rate of 12 milliseconds (although other sampling rates are possible). Relying on any of the algorithms described above can allow for the sensor to be used in any orientation about the 360° of the connection point with the object being swung or otherwise measured, although various improvements to the accuracy of the determinations can be achieved by accounting for some of the variables that can have a negative impact on the accuracy, and thus the algorithm for equation 4 typically provides the most accurate determination of the value of the angle θ.

Detecting a Handedness of a User

In determining the value of the angle θ, it is helpful to know the handedness of the user. It allows for the use of the proper value of H in the omni-directional equations described above. It can also allow for more accurate information about the user to be recorded and later used, for example in generating an avatar for the user when using the system in conjunction with a game or learning tool associated with the control application. Aside from a user inputting the handedness directly into the system, the present application provides for three ways by which a handedness of a user can be determined.

In a first instance, a handedness can be determined by detecting a wrist rotation direction. A left-handed golfer typically exhibits counterclockwise wrist rotation during his or her backswing, while a right-handed golfer typically exhibits clockwise wrist rotation during his or her back swing. The system can be set-up such that any wrist rotation value over a particular threshold value, e.g., 18 degrees for a golf swing, will result in the direction of that rotation being assessed and a handedness of the golfer being assigned. So, if the wrist rotation is greater than 18 degrees and a clockwise rotation is determined, then the golfer is determined to be taking a right-handed swing, while if the wrist rotation is greater than 18 degrees and a counterclockwise rotation is determined, then the golfer is determined to be taking a left-handed swing. This handedness analysis can be performed on a swing-by-swing basis in case a user swings in both a right-handed and a left-handed manner, or in case a different user having a different handedness takes a swing. In other embodiments, the determination of the handedness once can set the handedness for the system going forward absent instructions from the user to recalculate or otherwise reset the handedness of the user. Further, this method of determining a handedness of a golfer does not typically extend to putts, and thus other methods for determining handedness can be incorporated into the system, either in combination or on their own.

A handedness of a golfer can also be determined by the combining the previously described gravity vector method and the previously described rotation velocity vector method. Typically, a left-handed golfer will exhibit, at the very start of a swing, predictions for the $\hat{x}_g$ axis via the rotational velocity vector method and the gravity vector method that are approximately parallel. Conversely, typically right-handed golfer will exhibit, at the very start of a swing, predictions for the $\hat{x}_g$ axis via the rotational velocity vector method and the gravity vector method that are approximately 180 degrees anti-parallel. Accordingly, by computing the initial gravity vector and the initial rotational velocity vector, the handedness of the user can be reliably determined.

In still a further instance, a handedness of a golfer can be based on a swing history. That is, to the extent the other two methods are not successful in making a determination of the user's handedness, the handedness used for purposes of the algorithm can defined based on the determined handedness of the previous swing.

Notably, the three methods for determining handedness described above can be used in parallel. For example, in one exemplary embodiment, the system can be set-up such that a determination made using the first method, i.e., the wrist rotation direction method, always overrides a determination made by the other two methods because the wrist rotation direction is typically simpler than the second method and more accurate than both the second and third methods. Likewise, because the second method, i.e., the combination of the gravity vector methods and rotation velocity vector methods, can typically be more accurate than the third method, the system can be set-up such that a determination made using the second method always overrides a determination made by the third method.

Operation of the IMU—Changing Uses, Modes, or Stages

Not only is the IMU 20 an improved plug-and-play option because it is omni-directional, but it is also equipped to be plugged-and-played across multiple uses (e.g., sports uses and uses with prosthetics), modes or contexts (e.g., golf and tennis), and stages (e.g., a non-putt golf swing and a putt golf swing), without requiring any significant reprogramming by the user. The user merely selects the desired use, mode, or stage, either by way of the control application or, in some instances, on the IMU 20 directly, and the system automatically and seamlessly adjusts itself for the new use, mode, or stage. More particularly, in some exemplary embodiments, no more than four aspects of the functionality of the IMU 20 are changed when switching modes from one sport to another (or when switching uses or stages). These variable functional elements of the IMU 20 are constituted by firmware changes within the IMU. To the extent any reprogramming occurs when changing from one sport to another, or when changing different uses or stages, the firmware does so seamlessly and without the knowledge of the typical user. No modifications are made to the existing software when the sensor is attached to a new object for a different type of use, mode, or stage.

More particularly, when a user selects a different sport using the control application, for instance changing from golf to lacrosse, the IMU 20 is immediately, autonomously, and seamlessly transitioned by the control application via the Bluetooth Low Energy radio component 60 to be ready for the new sport. The action of switching from one sport to another, which can be accomplished by a user simply pushing a single button in the control application, causes the control application to instruct the IMU 20 to modify several functional elements stored in the RAM. This also occurs when a user changes from one use to another, or from one stage to another.

One functional element that can be adjusted for a different mode, use, or stage is the event detection parameters. The IMU 20 is configured to detect an event, with the event being a set of readings that indicate to the IMU that it should be recording. The detection occurs as a result of one or multiple of the accelerometer, gyroscope, and magnetometer exhibiting readings within a range of acceptable values for a threshold amount of time. These values and threshold times are assigned based on the particular mode/use/stage, and a person having skill in the art will recognize or be able to readily determine what typical values and threshold amounts of time would be for a given mode/use/stage. When a mode, use, or stage is changed, the control application can be configured to communicate to the IMU 20 the appropriate values and threshold amounts for the new mode, use, or stage so that the amounts are loaded up for use in the next events of the system.

A second functional element that can be adjusted for a different mode, use, or stage is which components of the IMU 20 are active. The IMU 20 can record up to nine (9) axes of information, which is three (3) axes each for the accelerometer 52, gyroscope 54, and magnetometer 56. Certain modes, however, do not need to record all axes of data. When a mode, use, or stage is changed, the control application can be configured to communicate to the IMU 20 which components of the IMU should be active for the newly selected mode, use, or stage. The various axes are selectively activated based on the information provided for by the control application.

A third functional element that can be adjusted for a different mode, use, or stage pertains to sampling, both the sampling rate and the sampling period. The sampling rate and sampling period can be different for various modes, uses, and stages. In one exemplary embodiment, the sampling can be set to anything up to 2 kHz for the gyroscope 54, 1 kHz for the accelerometer 52, and 80 Hz for the magnetometer (current) 56. The sampling rate can be set at five (5) to ten (10) times the maximum desired frequency to capture relevant data in a sport associated with the selected mode. For example, in some embodiments the system analyzing golf can have a sampling rate of 83 Hz (current). Further, the sampling period can be such that the full motion waveform can be captured by the IMU 20. The sampling period can be limited on the high end by the available RAM memory of the IMU, and on the low end by the sampling rate. When a mode, use, or stage is changed, the control application can be configured to communicate to the IMU 20 what the sampling rate and sampling period should be for the new mode, use, or stage. In some instance, this third functional element can be considered two separate functional elements, i.e., the sampling rate and the sampling period, in which case no more than five aspects of the functionality of the IMU 20 are changed when switching modes from one sport to another (or when switching uses or stages)

A fourth functional element that can be adjusted for a different mode, use, or stage pertains to the resolutions/dynamic range of the IMU 20. The dynamic range of the IMU 20 can be such that the maximum recorded value is below the maximum possible reading of the IMU. Further, the minimum resolution of the IMU 20 can be such that it is capable of detecting the minimum desired portions of the swinging device. Dynamic range and resolution can be directly related, thus they are typically reprogrammed when changing modes, uses, or stages. For example, in one exemplary embodiment, the gyroscope 54 has a dynamic range of +/−1000 deg/s, and a minimum resolution of 0.060 deg/s for a non-putt golf swing, but when a stage is changed to a putt mode, the gyroscope 54 has a reduced dynamic range of +/−250 deg/s and a minimum resolution of 0.0076 deg/s.

Although the ability to change parameters and the like is primarily described above with respect to changing a mode (e.g., changing from one sport to another), a person skilled in the art will recognize that these teachings can also be applied when changing between different uses (e.g., use for a sport vs. use for prosthetics) and different stages (e.g., a putting stroke and a non-putting stroke in golf) without departing from the spirit of the present disclosure. A person skilled in the art, in view of the present disclosure, would be able make these modifications for different uses and stages without much difficulty.

An example of using the IMU 20 to record data occurs in the following manner. First, the IMU 20 can be coupled to an object to be swung, e.g., a golf club, using techniques described herein or otherwise known to those skilled in the art. The IMU 20, and more particularly the accelerometer 52 in some instances, can detect that the golf club is at an "address position" and ready to be swung. The user can begin the swinging motion, which can cause the IMU 20 to detect that the address position has been left based on the change in speed an orientation. This "velocity from address" can be determined, for instance, by the gyroscope 54. Over the sampling window that occurs during the swing, the accelerometer 52 and gyroscope 54 data can be sampled to create a six-dimensional representation of the motion of the IMU 20.

The raw data can be gathered and subsequently transmitted through via the Bluetooth Low Energy radio component 60 to a remote location, such as a smart device, a gateway, which is a component described in greater detail below, a control or mobile application, or other data storage location, such as the cloud. The motion of the IMU 20 can be used to calculate the true motion of the golf club, for example, using linear algebra. In some instances, the motion or path of the golf club can be recorded as a data output from the swing. The knowledge of the position of the golf club at the address position can be used to determine the time and position of the golf club upon impact with a ball, which in turn can be used to determine at least the speed, angle, and timing of the golf club at impact. A person skilled in the art will recognize other data that can also be determined during and after the swinging process, including but not limited to the data recorded by the IMU 20 as described above.

Another example of using the IMU 20 to record data associated with a swing, this time a baseball swing, is provided herein. The examples of golf and baseball are by no means limiting, and a person skilled in the art will recognize how these teachings can be applied for other sports (modes), uses, and stages. First, the IMU 20 can be coupled to a baseball bat using techniques described herein or otherwise known to those skilled in the art. Before a session of swings begins, the user can hold the baseball bat directly across home plate to establish an address position, while pressing a record button on the IMU 20. The record button can be the push button 40 described above provided it is used in conjunction with a suitable switch, or it can be a separate button provided for as part of the IMU and in communication with relevant components on the PCB 50. The button can trigger a measurement, for example, via the magnetometer 56, which can make a note of the direction corresponding to directly over home plate. A swing can begin, causing the IMU 20 to leave the address position with a measurable speed and orientation. This "velocity from address" can be determined, for example, using the gyroscope 54. Over the sampling window of a baseball swing, the magnetometer 56 and gyroscope 54 data can be sampled to create a six-dimensional representation of the motion of the IMU 20.

The raw data can be gathered and subsequently transmitted through via the Bluetooth Low Energy radio component 60 to a remote location, such as a smart device, a gateway, which is a component described in greater detail below, a control or mobile application, or other data storage location, such as the cloud. The motion of the IMU 20 can be used to calculate the true motion of the baseball bat, for example, using linear algebra. In some instances, the motion or path of the baseball bat can be recorded as a data output from the swing. The knowledge of the position of the baseball bat at the address position can be used to determine the time and position of the bat upon impact with a ball, which in turn can be used to determine at least the speed, angle, and timing of the bat at impact. A person skilled in the art will recognize other data that can also be determined during and after the swinging process.

In one exemplary embodiment of changing the stage for the IMU 20, a user can select between a golf swing that is a putt (sometimes referred to as a "golf putt") and a golf swing that is not a putt (sometimes referred to as a "golf swing") from the control or mobile application. Switching from one mode to the other is a seamless as switching between different modes (e.g., sports). Thus, when the stage is changed from golf swing to golf putt, one or more of the event detection parameters, the selection of which components of the IMU 20 are active, the sampling rate, the sampling period, and the resolution/dynamic range of the IMU is adjusted to account for the different nature of the swing. A person skilled in the art, in view of the present disclosures, would understand the parameter values that can be used in each of the two stages.

One exemplary, non-limiting embodiment of a condensed MATLAB script of the golf sensor algorithm is provided below. A person skilled in the art will recognize other scripts and the like that can be used in accordance with the present disclosures without departing from the spirit of the present disclosure.

MATLAB SCRIPT

```
function out = AlgorithmRefined (RotMatrix,AccMatrix,Ts)
%Assume that centripetal acceleration is much smaller than
linear
%acceleration. Check this later!
% Correct for gravitational acceleration
L = 0.57; % Distance from sensor and assumed fixed point
% Define an initial Theta, Phi, and Gamma based on acc reading
Theta0 = atan2(-AccMatrix(1,1),-AccMatrix(3,1));
q = [L*sin(Theta0); 0; -L*cos(Theta0); 1]; % Initial location of
sensor in OL. Homogenous coordinates
% Define initial coordinate of the xyz axes in OL
z = -q([1:3])/sqrt(q(1)^2+q(3)^2);
y = [0; 1; 0];
x = cross (y,z);
sizeRotMatrix = size(RotMatrix);
AccLVec = [0;0;0];
% For each xyz gyro value
for i = 1:sizeRotMatrix(2)
    % Check if RotMatrix values are rad/s or deg/s. This assumes
rad/s
    spin = [RotMatrix (1,i); RotMatrix(2,i); RotMatrix(3,i)]*Ts;
% The amount of spin is rot vel * time elapsed
    RotVal = sqrt(spin(1)^2+spin(2)^2+spin(3)^2);
    w = spin/RotVal; % Normalize so that w is the axis (in O)
that is rotated about, and RotVal is the amount of rotation
    M = [x(1) y(1) z(1); x(2) y(2) z(2); x(3) y(3) z(3)]; % Set
up transformation matrix from O to OL
    wL = M*w; % Transform rotation axis into OL
    Acc = [AccMatrix(1,i); RotMatrix(2,i); RotMatrix(3,i)];
    AccL = M*Acc;
    AccLFixGrav = AccL + [0; 0; 9.81]; % Correct for gravity.
WATCH SCALE!
    AccLVec = [AccLVec AccLFixGrav];
    vL = sum(AccLVec')*Ts;
    wLPrime = [0 -wL(3) wL(2); wL(3) 0 -wL(1); -wL(2) wL(1) 0];
    RotStep = expm(wLPrime*RotVal); % Compute the rotation
matrix in OL
    GTransform = [RotStep vL*Ts; 0 0 0 1];
    q = [q GTransform*q(:,i)]; % Apply RotStep to q(end) to find
next point
    % Transform xyz, to obtain next set of xyz in OL
    z = RotStep*z;
    y = RotStep*y;
    x = RotStep*x;
end
out = q;
end
```

Operation of the IMU—Use with Prosthetics

As described throughout the present disclosure, the sensor or IMU 20 and other components of the described systems can be used in fields outside of athletics. One such example is the medical field, and more particularly with prosthetics. For example, the IMU 20 can be useful at least in recording and transmitting data for gait and limb analysis.

In one exemplary embodiment, a single IMU 20 can be coupled to a prosthetic using any number of techniques known for coupling two objects together. The IMU 20 can then be operated to record relevant information. For example, in some instances it may be desirable to only operate the accelerometer to acquire data because it requires less power to operate than the gyroscope. As a result, the IMU 20 can continuously acquire data for a day or even a week off a single charge, depending, at least in part, on the sampling rate. In other instances, both the accelerometer 52 and the gyroscope 54 can be operated to acquire data. In such instances, the system can be programmed such that the gyroscope 54 only turns on to record when particular event patterns are detected on the accelerometer 52. As a result, memory and power can be conserved while still obtaining the additional data acquisition benefits that result from also using the gyroscope 54 to acquire data.

In some embodiments, multiple IMUs 20 can be coupled to a prosthetic using any number of techniques known for coupling two objects together. One or both of the accelerometer 52 and gyroscope 54 for a given IMU 20 can be used to acquire data as previously described. Further, each of the IMUs 20 can be configured communicate event patterns to each other via the Bluetooth Low Energy radio components 60 of the IMUs 20. This can allow accurate motion reconstructions to be recorded as a result of recording motion data on multiple degrees of freedom of the prosthetic. In still other embodiments, one or more IMUs 20 can be coupled to multiple prosthetics and operated in a manner akin with the methods provided for herein.

To insure proper operation of the IMUs 20 in this field, care should be taken to manage the memory size and signal accuracy associated therewith. For example, the code used to operate the IMUs 20, and the data acquired by the IMUs, should be optimized to minimize the amount of space consumed by each. Further, in some embodiments, two rounds of signal/noise suppression algorithms can be used to further help manage memory size and signal accuracy constraints. For example, one round of signal/noise suppression can be implanted on the IMU 20 itself, while another round of signal/noise suppression can take place on the control application after the data has been communicated to using the Bluetooth Low Energy radio component(s) 60.

The control application associated with use in conjunction with prosthetics can allow a user to access all of the information associated with the sensor. Like other embodiments, the data will automatically and seamlessly sync with the control application via the Bluetooth Low Energy radio component(s) 60. Gait and limb analysis information can be displayed on the control application in a graphically appealing and intuitive manner, much the way a swing plane can be graphically displayed.

With particular reference to an above-the-knee leg prosthetic, the IMU(s) 20 can be placed above the knee joint, below the knee joint, or both. In such instances, the IMU(s) 20 can obtain the following data for analysis by the patient as well as the patient's prosthetic clinician: (1) amount of steps taken per day; (2) distribution of activity during a day (e.g., time spent running, walking, sitting, etc.), the amount of time it takes to put a prosthetic on (sometimes referred to as a donning time), the amount of time it takes to put a prosthetic away (sometimes referred to as doffing time), and a gait motion analysis (which typically uses two or more sensors).

Gateway

Figure 15A:
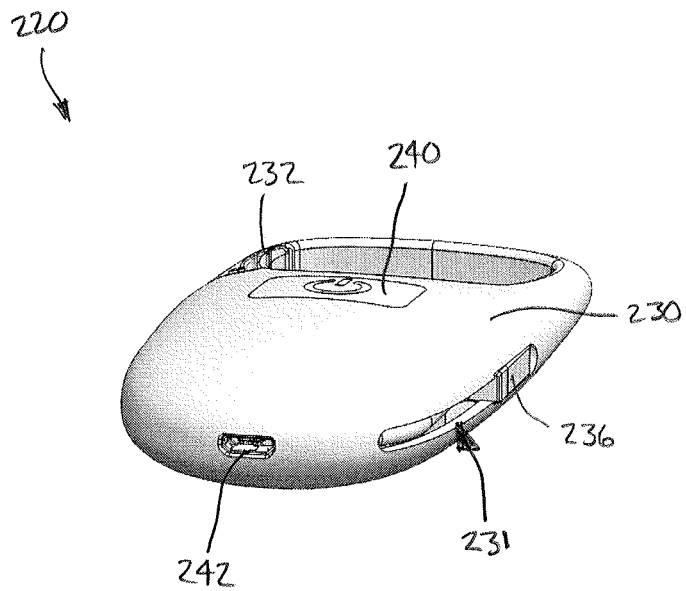
FIG. 15A is a perspective top view of the gateway of FIG. 12A.
Figure 15B:
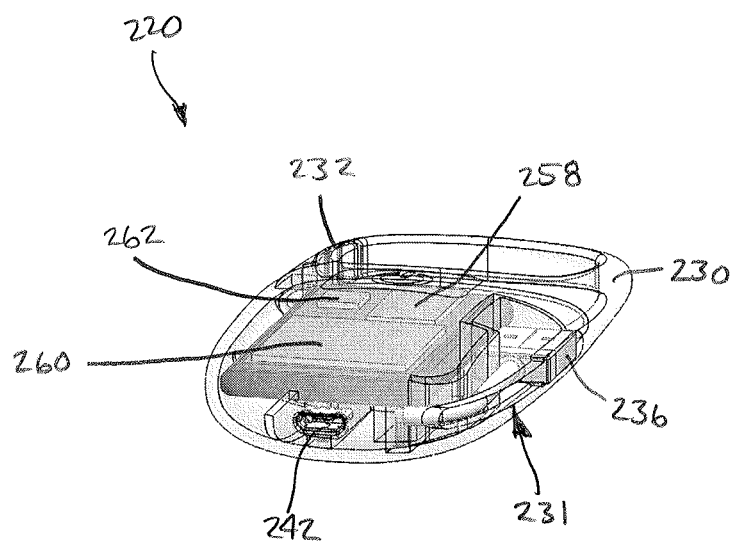
FIG. 15B is a partially transparent top view of the gateway of FIG. 15A.
Figure 16:
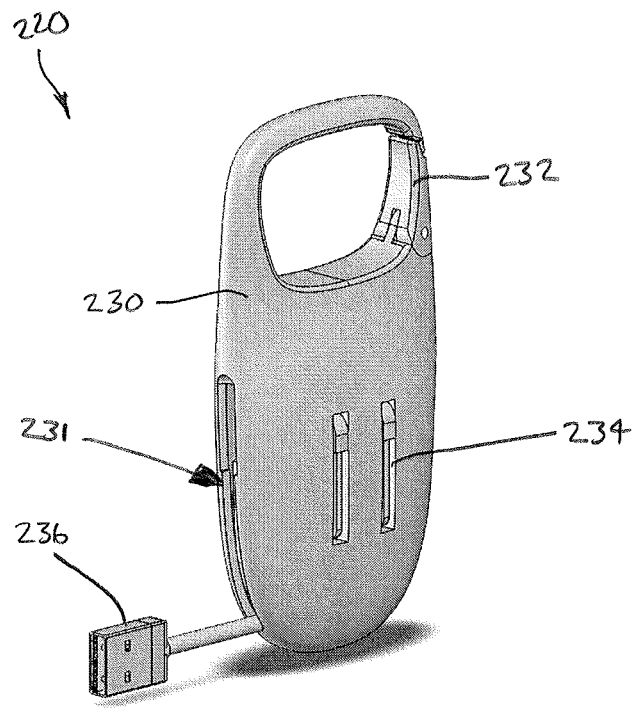
FIG. 16 is a perspective back view of the gateway of FIG. 12A.
Figure 17:
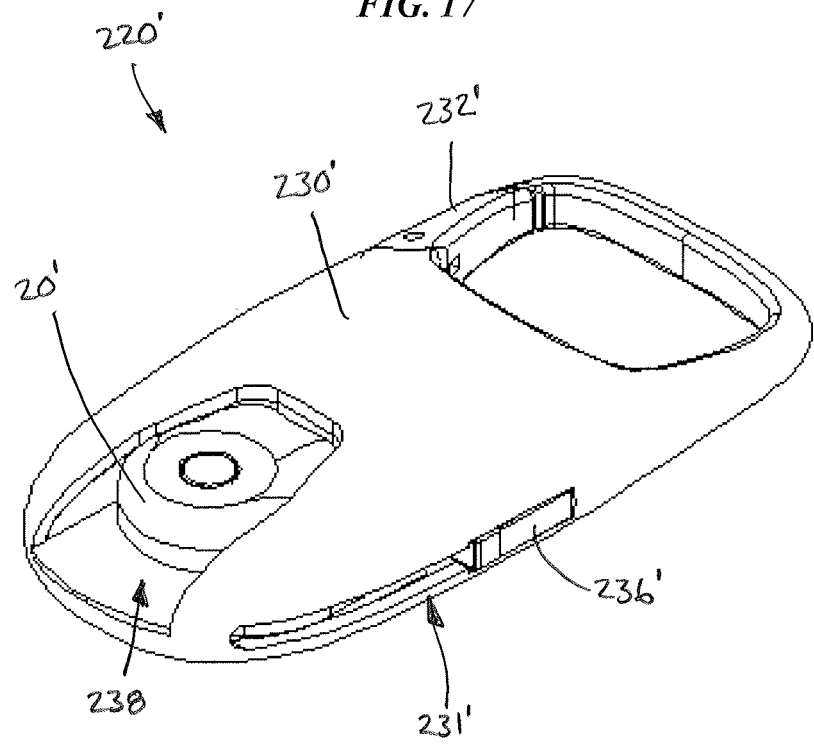
FIG. 17 is a perspective top view of another exemplary embodiment of a gateway configured to wirelessly communicate with a sensor like the sensor of FIG. 9A and configured to receive and store the sensor.
Figure 18A:
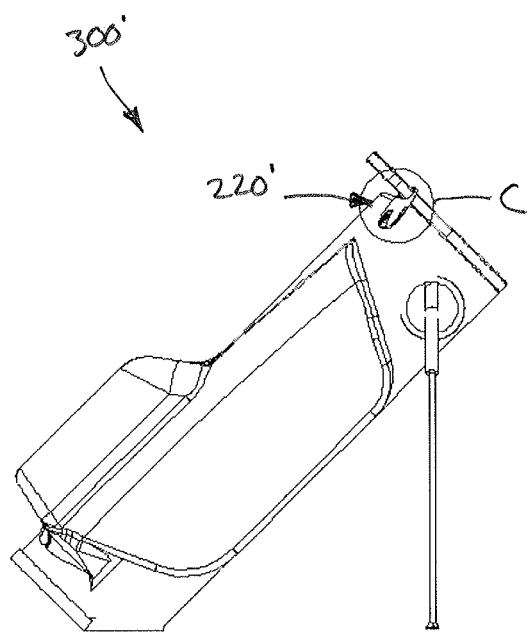
FIG. 18A is a side view of a golf bag having the gateway of FIG. 17 attached thereto.
Figure 18B:
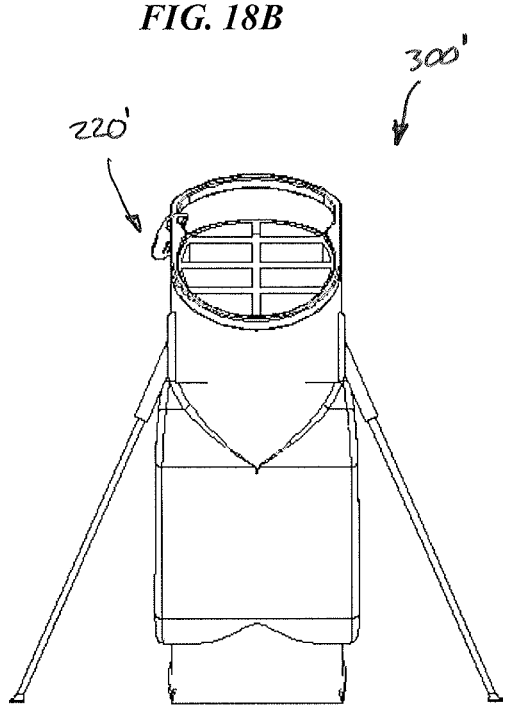
FIG. 18B is a front view of the golf bag and gateway of FIG. 18A.
Figure 18C:
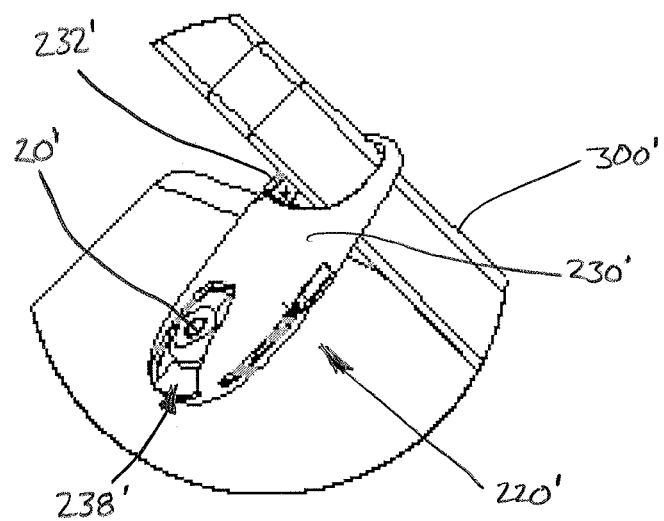
FIG. 18C is a detailed perspective side view of the gold bag and gateway of FIG. 18A.

FIGS. 12A-16 provide for one illustration of a gateway 220 that can be used in conjunction with the disclosures provided for herein, and FIGS. 17-18C provide for a second gateway 220' that can also be used in conjunction with the disclosures provided for herein. The gateways 220, 220' can be set-up in a machine-to-machine context and adapted for stringent pre-certification and final certification requirements for wireless use. The gateways 220, 220' can include hardware, software, and cellular connections on a wireless network, e.g., a Verizon® network.

Use of the gateways 220, 220' can require a cellular connection with a monthly subscription fee per user. They can also be equipped with a Bluetooth Low Energy radio component and customer software that allows the gateway to be used exclusively with the sensor or IMUs provided for in the present disclosure, or otherwise derivable therefrom. In some embodiments, the gateways 220, 220' can communicate directly with an IMU through a universal asynchronous receiver/transmitter (UART) connection. The gateways 220, 220' can receive Bluetooth Low Energy data communication from the IMU, and if a proper Bluetooth Low Energy enabled IMU is detected, the IMU can transmute data recorded or otherwise determined by the IMU from Bluetooth Low Energy protocol to Code Division Multiple Access (CDMA) communication protocol. The data can then be uploaded to a control application, such as a web-based or mobile application, using Transmission Control Protocol (TCP) commands.

As shown in FIGS. 18A-18C, the gateways 220, 220' can be portable devices that can clip onto a golf bag 300', or otherwise be placed near a practice area. Users can have the option to use the gateways 220, 220' without the use of a smart device. Data can be transmitted in real time to the cloud or other remote location. Users can have access to their personal dashboard that can track and monitor their data and progress over time. Users can further have the option to monitor data for one sport, e.g., golf or baseball, or both, or a third or more sports as they are included as part of the programming. The cost of monthly data plans can be based on the amount and different types of data used.

By using the gateways 220, 220' separate from a smart device, it can prevent lag times and other undesirable results that can transpire when a smart device is used simultaneously as a data tracking, storing, and/or transmitting device and for other purposes, such as to make and receive telephone calls, send and receive e-mails, browse the Internet, play other games and applications, and use other features of a smart device.

Data that is generated can be stored using cloud-based turnkey solutions that allow the systems provided for herein to manage and support the information and related content for the user in a user-friendly portal, while the provider can charge each user through such user-friendly portals.

Gateways such as the gateways 220, 220' can have a variety of configurations, and as described herein can afford at least the benefit of not having to necessarily tie data storage and transmission directly to a smart device. In the illustrated embodiments, the gateways 220, 220' include housings 230, 230' having attachment levers 232, 232' for connecting the gateways to any number of locations and various features to allow the gateways to send and receive data, as well as charge itself and/or the associated sensor or IMU.

Figure 14:
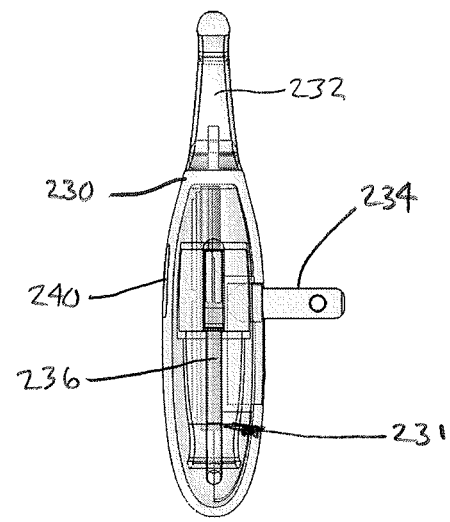
FIG. 14 is a partially transparent side view of the gateway of FIG. 13.

The housing 230, 230' can include the attachment lever 232, 232', which can be spring-loaded in a manner similar to a carabineer, which allows the gateways 220, 220' to be attached to any number of items, such as golf bags, fences, articles of clothing, etc. The gateways 220, 220' can include one or more ways to charge itself and/or to transmit data. As shown in FIGS. 14 and 16, a folding AC receptacle 234 can be included to allow the gateway 220 to be plugged into a wall outlet so it can be charged for later use. The AC receptacle can be exposed (FIG. 14) for charging purposes and then folded into the body of the housing 230 (FIG. 16) when not in use. Although not shown, the gateway 220' can also include a folding AC receptacle. In some embodiments, a USB male 236, 236' can also be included which can be used to hook to a USB-compatible device, such as a computer, to allow for data to be transmitted from the gateways 220, 220' to the USB-compatible device. A channel 231, 231' can be formed in the housing 230, 230' to allow the USB male 236, 236' to be selectively exposed and stored as desired. The USB male 236, 236' can also be used to charge the gateways 220, 220', similar to the AC receptacle 234, relying on the USB-compatible device as the charging power source. Data can also be transmitted wirelessly by including an antenna, Bluetooth capable components, and/or other components known to those skilled in the art for wireless data transmission, for instance including one or more such components as part of a printed circuit board (PCB) or printed circuit assembly (PCA) of the gateways 220, 220'. The components of the gateways 220, 220' can be charged by a batter provided for therein, which can be charged as described herein.

In some embodiments, such as the gateway 220', the gateway can also be adapted to allow a sensor, as shown the sensor 20', to be associated with the gateway and charged simultaneously with the gateway 220'. As shown in FIG. 17, a docking bay 238' can be provided that is configured to receive the sensor 20'. The sensor 20' can be connected to the gateway 220', and then when features such as an AC receptacle and/or the USB male 236' are used to charge the gateway 220', they can also charge the sensor 20'. This also makes it easy for a user to keep the components stored together when traveling and the like, as shown in FIG. 18C in which the sensor 20' is docked in the gateway 220' and the gateway 220' is attached to the golf bag 300'.

Figure 12A:
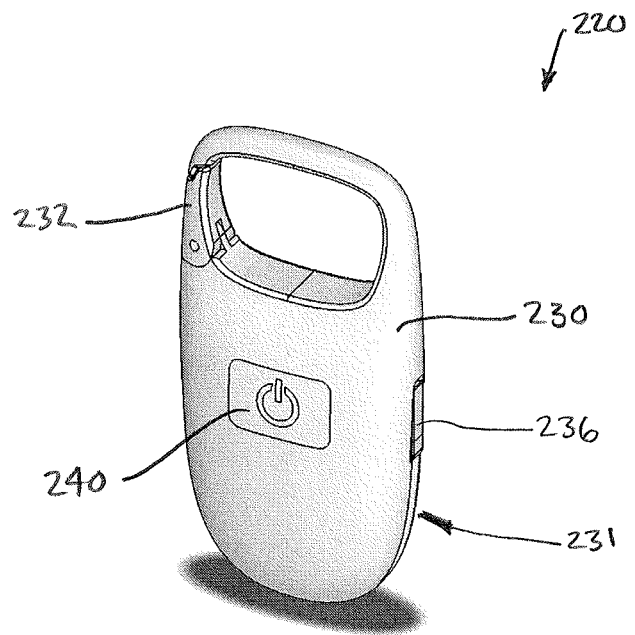
FIG. 12A is a perspective view of one exemplary embodiment of a gateway configured to wirelessly communicate with a sensor like the sensor of FIG. 1A, a pivoting latch of the gateway being disposed in a closed position.
Figure 12B:
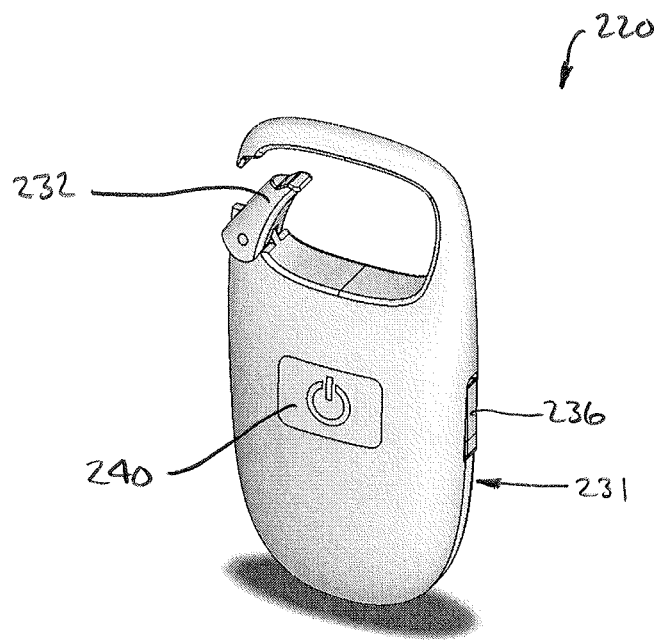
FIG. 12B is a perspective view of the gateway of FIG. 12A, the pivoting latch being in an open position.
Figure 13:
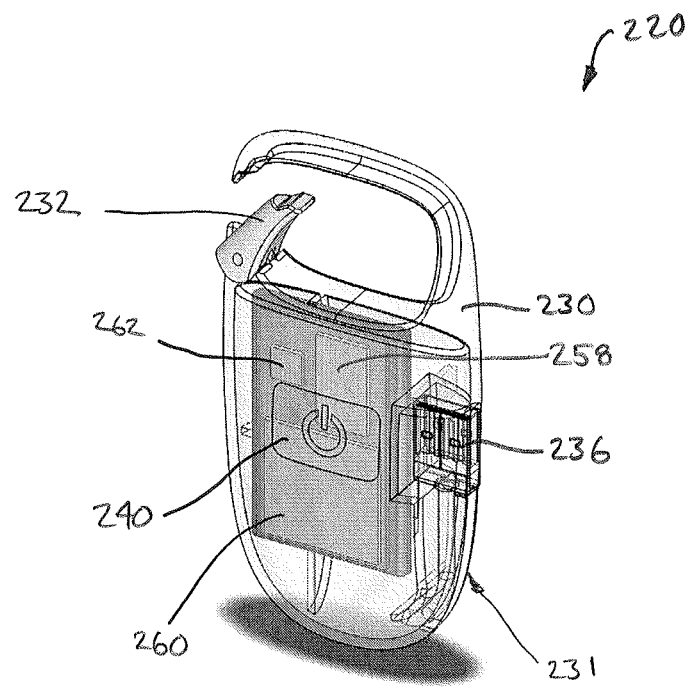
FIG. 13 is a partially transparent perspective view of the gateway of FIG. 12B.

Other non-limiting examples of the components of the gateway are provided for in the figures. For example, as shown in FIGS. 12A and 12B, the gateways 220 can include a power button 240 associated with the housing 230 to turn the gateway ON or OFF. The ability for the gateway to stay on for a period of time or power off after a period of time can be similar to the power on, power off capabilities of the IMU 20 described above. FIGS. 13 and 15B illustrate a number of internal components of the gateway 220, including a microcontroller 258, a Bluetooth Low Energy radio component 260, and a cellular module 262. The microcontroller 258 can be adapted to command various features and programs associated with the gateway 220, the Bluetooth Low Energy radio component 260 can be used to send and receive data, and the cellular module can be used to connect the gateway 220 with a wireless network. FIGS. 15A and 15B illustrate a port 242 that can allow for a power source to be connected to the gateway 220, thus charging any power source (not labeled), such as a battery, disposed in the housing 230. A person skilled in the art will recognize a variety of other features that can also be incorporated into the gateways 220, 220' without departing from the spirit of the present disclosure. Further, a person skilled in the art will recognize that features provided for in one of the gateways 220, 220' can also be adapted for use in the other gateway.

System Architecture

Figure 19:
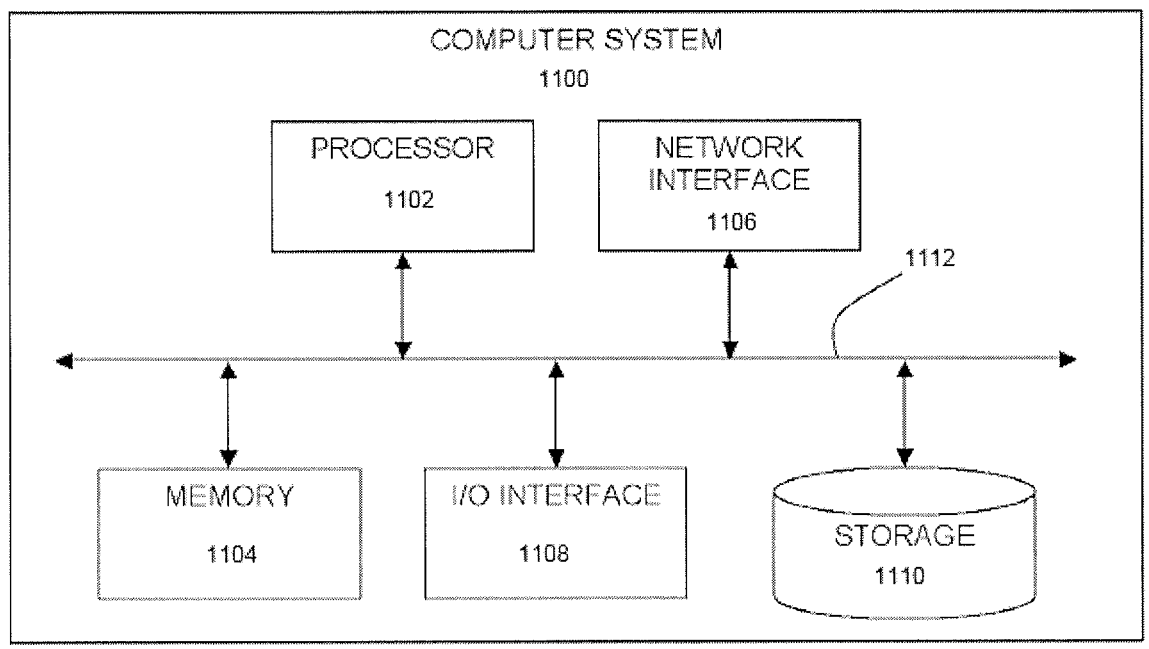
FIG. 19 is a schematic illustration of a computer system.

A person skilled in the art will recognize a variety of different computer-based technologies that can be used to carry out disclosures contained herein as they pertain to various algorithms and control applications. For example, the devices, systems and methods disclosed herein can be implemented using one or more computer systems, such as the exemplary embodiment of a computer system 1100 shown in FIG. 19.

As shown, the computer system 1100 can include one or more processors 1102 which can control the operation of the computer system 1100. The processor(s) 1102 can include any type of microprocessor or central processing unit (CPU), including programmable general-purpose or special-purpose microprocessors and/or any one of a variety of proprietary or commercially available single or multi-processor systems. The computer system 1100 can also include one or more memories 1104, which can provide temporary storage for code to be executed by the processor(s) 1102 or for data acquired from one or more users, storage devices, and/or databases. The memory 1104 can include read-only memory (ROM), flash memory, one or more varieties of random access memory (RAM) (e.g., static RAM (SRAM), dynamic RAM (DRAM), or synchronous DRAM (SDRAM)), and/or a combination of memory technologies.

The various elements of the computer system 1100 can be coupled to a bus system 1112. The illustrated bus system 1112 is an abstraction that represents any one or more separate physical busses, communication lines/interfaces, and/or multi-drop or point-to-point connections, connected by appropriate bridges, adapters, and/or controllers. The computer system 1100 can also include one or more network interface(s) 1106, one or more input/output (IO) interface(s) 108, and one or more storage device(s) 1110.

The network interface(s) 1106 can enable the computer system 1100 to communicate with remote devices (e.g., other computer systems) over a network, and can be, for example, remote desktop connection interfaces, Ethernet adapters, and/or other local area network (LAN) adapters. The JO interface(s) 1108 can include one or more interface components to connect the computer system 1100 with other electronic equipment. For example, the JO interface(s) 1108 can include high speed data ports, such as USB ports, 1394 ports, etc. Additionally, the computer system 1100 can be accessible to a human user, and thus the JO interface(s) 1108 can include displays, speakers, keyboards, pointing devices, and/or various other video, audio, or alphanumeric interfaces. The storage device(s) 1110 can include any conventional medium for storing data in a non-volatile and/or non-transient manner. The storage device(s) 1110 can thus hold data and/or instructions in a persistent state (i.e., the value is retained despite interruption of power to the computer system 1100). The storage device(s) 1110 can include one or more hard disk drives, flash drives, USB drives, optical drives, various media cards, and/or any combination thereof and can be directly connected to the computer system 1100 or remotely connected thereto, such as over a network. The elements illustrated in FIG. 19 can be some or all of the elements of a single physical machine. In addition, not all of the illustrated elements need to be located on or in the same physical or logical machine. Rather, the illustrated elements can be distributed in nature, e.g., using a server farm or cloud-based technology. Exemplary computer systems include conventional desktop computers, workstations, minicomputers, laptop computers, tablet computers, phone-tablets or "phablets," PDAs, mobile phones, smart phones, music players (e.g., iPods®), wearable devices (e.g., watches, rings, bracelets, eyeglasses, virtual reality headsets, chest-bands), and the like.

Although an exemplary computer system is depicted and described herein, it will be appreciated that this is for sake of generality and convenience. In other embodiments, the computer system may differ in architecture and operation from that shown and described here.

One skilled in the art will appreciate further features and advantages of the invention based on the above-described embodiments. Accordingly, the invention is not to be limited by what has been particularly shown and described, except as indicated by the appended claims. Further, the present disclosures can be implemented in conjunction with a variety of other features designed to enhance a user experience. By way of non-limiting example, the present disclosures can be used in conjunction with learning and training golf tools, such as impact indication and data tracking devices and methods described in U.S. Patent Application Publication No. 2014/0274439 of Sanchez et al., the contents of which is incorporated herein by reference in its entirety.

Additionally, although the present disclosure primarily discusses and illustrates the devices, systems, and methods being used in conjunction with a swinging device, including primarily a golf club, the devices, systems, methods, and related disclosures can be easily adapted for use in a variety of other fields in which the recording and transmitting data is desirable. Examples of such fields include but are not limited to other sports (e.g., baseball, tennis, lacrosse, hockey, billiard, badminton, squash, racquetball, table tennis, and other sports that use sticks, rackets, bats, cues, or the equivalent), medical (e.g., prosthetics), aerospace, military, law enforcement, children's toys, games, hobbies, and strength testing. All publications and references cited herein are expressly incorporated herein by reference in their entirety.

What is claimed is:

1. A sensor for measuring data, comprising:
   a housing;
   a circuit board assembly disposed with the housing, the circuit board assembly including a wireless transmission element and at least one of an accelerometer and a gyroscope; and
   a power source electrically coupled to the circuit board assembly to provide power to components of the circuit board assembly;
   wherein the sensor is configured to be attached to an object and measure data associated with the object regardless of an orientation of a coordinate system of the sensor with respect to an orientation of a coordinate system of the object,
   wherein the coordinate system of the sensor comprises:
      an x-axis that includes a center of the sensor on an outer surface of the housing and a defined location on the outer surface of the housing a distance away from the center;
      a z-axis that includes the center of the sensor and extends vertically upwards such that it is approximately perpendicular to the outer surface of the housing; and
      a y-axis that is a cross product of the x-axis and the z-axis, and
   wherein an angle defined by the y-axis of the coordinate system of the sensor and a y-axis of the coordinate system of the object is determined and accounted for when measuring data associated with the object, the angle being able to have a non-zero value,
   wherein the angle defined by the y-axis of the coordinate system of the sensor and the y-axis of the coordinate system of the object is determined based on one or more rotational velocity vectors measured by the gyroscope along the x-axis and the y-axis of the coordinate system of the sensor, and
   wherein a determination of the angle defined by the y-axis of the coordinate system of the sensor and the y-axis of the coordinate system of the object is determined in part based on a detection and measurement by the gyroscope of a rotation about a z-axis of the coordinate system of the object, wherein the detection and measurement by the gyroscope is a detection and measurement by one and only one gyroscope of one and only one sensor.

2. The sensor of claim 1, wherein the housing further comprises a button associated therewith and configured to selectively activate the power source to supply power to components of the circuit board assembly.

3. The sensor of claim 1, further comprising a microcontroller associated with the circuit board and configured to provide commands to components of the circuit board assembly to control operation of the same.

4. The sensor of claim 1, wherein the object is a swinging device, and the coordinate system of the object comprises:
   a z-axis that extends approximately vertically along a shaft of the swinging device in a direction similar to the direction of the z-axis of the coordinate system of the sensor;
   a y-axis that is approximately parallel to a head of the swinging device that is coupled to the shaft of the swinging device and extends towards an object to be struck by the head; and
   an x-axis that is approximately perpendicular to the head of the swinging device and extends to one side of a user of the swinging device.

5. The sensor of claim 1, wherein the angle defined by the y-axis of the coordinate system of the sensor and the y-axis of the coordinate system of the object is determined based on measurements made by the accelerometer along the x-axis and the y-axis of the coordinate system of the sensor.

6. A system for use in multiple swinging contexts, comprising:
   a sensor configured to be associated with multiple types of swinging devices, the sensor including a housing, a circuit board assembly disposed with the housing, the circuit board assembly including a wireless transmission element and at least one of an accelerometer and a gyroscope, and a power source electrically coupled to the circuit board assembly to provide power to components of the circuit board assembly; and
   a control application configured to communicate with the sensor to adjust operation parameters that correlate with the type of swinging device to which the sensor is attached,
   wherein data that is determined and transmitted by the sensor is based on a type of use for the sensor selected using the control application, and
   wherein the sensor is further configured to attach to the multiple types of swinging devices and to measure data associated with the multiple types of swinging devices regardless of an orientation of a coordinate system of the sensor with respect to an orientation of a coordinate system of the multiple types of swinging devices,
   wherein the coordinate system of the sensor comprises:
      an x-axis that includes a center of the sensor on an outer surface of the housing and a defined location on the outer surface of the housing a distance away from the center;
      a z-axis that includes the center of the sensor and extends vertically upwards such that it is approximately perpendicular to the outer surface of the housing; and
      a y-axis that is a cross product of the x-axis and the z-axis, and
   wherein an angle defined by the y-axis of the coordinate system of the sensor and a y-axis of the coordinate system of one of the multiple types of swinging devices is determined and accounted for when measuring data associated with one of the multiple types of swinging devices, the angle being able to have a non-zero value, wherein the angle defined by the y-axis of the coordinate system of the sensor and the y-axis of the coordinate system of one of the multiple types of swinging devices is determined based on one or more rotational velocity vectors measured by the gyroscope along the x-axis and the y-axis of the coordinate system of the sensor, wherein a determination of the angle defined by the y-axis of the coordinate system of the sensor and the y-axis of the coordinate system of one of the multiple types of swinging devices accounts for a direction that the object is swung, and wherein a determination of the angle defined by the y-axis of the coordinate system of the sensor and the y-axis of the coordinate system of the object is determined in part based on a detection and measurement by the gyroscope of a rotation about a z-axis of the coordinate system of one of the multiple types of devices that occurs when one of the multiple types of swinging devices is swung, wherein the detection and measurement by the gyroscope is a detection and measurement by one and only one gyroscope of one and only one sensor.

7. The system of claim 6, further comprising an adaptor configured to attach to one or more types of swinging devices and further configured to receive the sensor to associate the sensor with the one or more types of swinging devices.

8. The system of claim 6, wherein the sensor comprises at least one of an accelerometer, a gyroscope, and a magnetometer.

9. The system of claim 6, wherein the operation parameters that are adjusted based on communication from the control application include at least one of:
event detection parameters;
selectively activating axes of information associated with at least one of an accelerometer, a gyroscope, and a magnetometer of the sensor;
a sampling rate of at least one of an accelerometer, a gyroscope, and a magnetometer of the sensor;
a sampling period of the sensor; and
at least one of a resolution and a dynamic range of the sensor.

10. The system of claim 6, wherein the control application includes one or more learning modules that are activated based on the type of use for the sensor selected using the control application.

11. The system of claim 6, wherein the sensor is configured to transmit data wirelessly to at least one of a smart device and a gateway.

12. A method for measuring data, comprising:
attaching one and only one sensor to an object at any orientation such that a coordinate system of the sensor is located at any location with respect to an akin coordinate system of the object, the sensor including a housing, a circuit board assembly disposed with the housing, the circuit board assembly including a wireless transmission element and at least one of an accelerometer and a gyroscope, and a power source electrically coupled to the circuit board assembly to provide power to components of the circuit board assembly;
instructing the sensor to detect particular types of data based on the type of object to which the sensor is attached, wherein the sensor measures the data regardless of an orientation of a coordinate system of the sensor with respect to an orientation of a coordinate system of the object; and
receiving data from the sensor based on the types of data the sensor is instructed to detect,
wherein the coordinate system of the sensor comprises:
an x-axis that includes a center of the sensor on an outer surface of the housing and a defined location on the outer surface of the housing a distance away from the center;
a z-axis that includes the center of the sensor and extends vertically upwards such that it is approximately perpendicular to the outer surface of the housing; and
a y-axis that is a cross product of the x-axis and the z-axis, and
wherein an angle defined by the y-axis of the coordinate system of the sensor and a y-axis of the coordinate system of the object is determined and accounted for when measuring data associated with the object, the angle being able to have a non-zero value,
wherein the angle defined by the y-axis of the coordinate system of the sensor and the y-axis of the coordinate system of the object is determined based on one or more rotational velocity vectors measured by the gyroscope along the x-axis and the y-axis of the coordinate system of the sensor, and
wherein a determination of the angle defined by the y-axis of the coordinate system of the sensor and the y-axis of the coordinate system of the object is determined in part based on a detection and measurement by the gyroscope of a rotation about a z-axis of the coordinate system of the object, wherein the detection and measurement by the gyroscope is a detection and measurement by one and only one gyroscope of one and only one sensor.

13. The method for measuring data of claim 12, further comprising:
detaching the sensor from the object;
attaching the sensor to a second object at any orientation such that a coordinate system of the sensor is located at any location with respect to an akin coordinate system of the second object;
instructing the sensor to detect particular types of data based on the type of object to which the sensor is attached; and
receiving data from the sensor based on the types of data the sensor is instructed to detect,
wherein the second object is a different type of object than the first object, and
wherein no modifications are made to existing software of the sensor when attached to either the first object or the second object such that a user can attach and use the same sensor to the first object and the second object in real time without significant reprogramming.

14. The method for measuring data of claim 13, wherein the first object is a first type of swinging device and the second object is a second type of swinging device.

15. The method for measuring data of claim 12, wherein the object is a prosthetic.

16. The method for measuring data of claim 12, wherein the sensor comprises at least one of an accelerometer, a gyroscope, and a magnetometer, at least one of which is used to define an angle disposed between a y-axis of the coordinate system of the sensor and a y-axis of the coordinate system of the object, the angle being able to have a non-zero value.

* * * * *